(12) United States Patent
Kim et al.

(10) Patent No.: US 10,339,989 B2
(45) Date of Patent: Jul. 2, 2019

(54) PAGE BUFFER, A MEMORY DEVICE INCLUDING THE SAME AND A READ OPERATION METHOD THEREOF

(71) Applicant: SAMSUNG ELECTRONICS CO., LTD., Suwon-si, Gyeonggi-Do (KR)

(72) Inventors: Chaehoon Kim, Suwon-si (KR); Jin-Young Chun, Seoul (KR); Yunyeong Jeon, Daegu (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/637,099

(22) Filed: Jun. 29, 2017

(65) Prior Publication Data

US 2018/0137900 A1 May 17, 2018

(30) Foreign Application Priority Data

Nov. 17, 2016 (KR) .................. 10-2016-0153315

(51) Int. Cl.
| | |
|---|---|
| G11C 7/12 | (2006.01) |
| G11C 5/14 | (2006.01) |
| G11C 7/10 | (2006.01) |
| G11C 7/18 | (2006.01) |
| G11C 11/4091 | (2006.01) |
| G11C 11/56 | (2006.01) |
| G11C 16/24 | (2006.01) |
| G11C 16/04 | (2006.01) |

(52) U.S. Cl.
CPC ............ *G11C 7/12* (2013.01); *G11C 5/147* (2013.01); *G11C 7/106* (2013.01); *G11C 7/1048* (2013.01); *G11C 7/1057* (2013.01); *G11C 7/18* (2013.01); *G11C 11/4091* (2013.01); *G11C 11/5642* (2013.01); *G11C 16/24* (2013.01); *G11C 16/0483* (2013.01); *G11C 2211/5642* (2013.01)

(58) Field of Classification Search
CPC ....... G11C 7/12; G11C 7/1048; G11C 7/1057; G11C 7/106; G11C 5/147; G11C 11/4091; G11C 11/5642
See application file for complete search history.

(56) References Cited

U.S. PATENT DOCUMENTS

| | | | |
|---|---|---|---|
| 5,748,536 A * | 5/1998 | Kwon ................ | G11C 5/147 365/185.17 |
| 6,853,585 B2 * | 2/2005 | Lee .................. | G11C 16/3459 365/185.18 |
| 7,126,869 B1 | 10/2006 | Chou | |
| 7,206,240 B2 | 4/2007 | Gallo et al. | |

(Continued)

*Primary Examiner* — Sung Il Cho
(74) *Attorney, Agent, or Firm* — F. Chau & Associates, LLC

(57) ABSTRACT

A page buffer includes a pre-charge unit for pre-charging a bit line of a selected memory cell of a memory cell array via a first pre-charge line and pre-charging a sensing node via a second pre-charge line, during a pre-charge time, a bit line connection unit connected between the bit line and the sensing node and including a connecting node connected to the first pre-charge line, the bit line connection unit controlling a voltage of the sensing node, during a develop time, based on a bit line connection control signal and a sensing node voltage control signal, and a data input and output unit for generating sensing data by sensing a level of the voltage of the sensing node, during a sensing time.

16 Claims, 38 Drawing Sheets

(56) References Cited

U.S. PATENT DOCUMENTS

| | | | |
|---|---|---|---|
| 7,277,339 B2 | 10/2007 | Edahiro | |
| 7,512,020 B2* | 3/2009 | Lee | G11C 16/0483 365/189.05 |
| 7,679,966 B2 | 3/2010 | Kang et al. | |
| 8,169,831 B2 | 5/2012 | Nguyen et al. | |
| 8,310,891 B2* | 11/2012 | Kim | G11C 7/02 365/189.08 |
| 8,705,293 B2 | 4/2014 | She et al. | |
| 8,971,141 B2* | 3/2015 | Mui | G11C 7/067 365/203 |
| 9,852,796 B2* | 12/2017 | Jung | G11C 16/08 |
| 2002/0001227 A1* | 1/2002 | Kim | G11C 11/5621 365/185.18 |
| 2002/0105831 A1* | 8/2002 | Lee | G11C 16/28 365/185.21 |
| 2003/0076719 A1* | 4/2003 | Byeon | G06F 12/0893 365/200 |
| 2003/0174539 A1* | 9/2003 | Byeon | G11C 5/147 365/185.21 |
| 2008/0117701 A1 | 5/2008 | Chan et al. | |
| 2008/0225599 A1* | 9/2008 | Chae | G11C 11/5628 365/185.24 |
| 2008/0232177 A1* | 9/2008 | Choi | G11C 13/00 365/189.15 |
| 2009/0190403 A1* | 7/2009 | Kwak | G11C 11/5635 365/185.11 |
| 2009/0296468 A1 | 12/2009 | Nguyen et al. | |
| 2010/0202216 A1* | 8/2010 | Byeon | G11C 16/0483 365/185.25 |
| 2011/0305087 A1* | 12/2011 | Lee | G11C 16/0483 365/185.12 |
| 2012/0300568 A1 | 11/2012 | Mueller et al. | |
| 2013/0064008 A1* | 3/2013 | Kim | G11C 5/145 365/158 |
| 2013/0083607 A1* | 4/2013 | Joo | G11C 16/26 365/185.21 |
| 2013/0155777 A1* | 6/2013 | Chen | G11C 16/26 365/185.25 |
| 2013/0194872 A1* | 8/2013 | Sim | G11C 16/26 365/185.17 |
| 2013/0208538 A1* | 8/2013 | Yang | G11C 16/28 365/185.2 |
| 2014/0022853 A1* | 1/2014 | Choi | G11C 16/24 365/189.05 |
| 2014/0355354 A1* | 12/2014 | Ahn | G11C 16/26 365/185.21 |
| 2015/0023108 A1* | 1/2015 | Kang | G11C 16/26 365/185.21 |

* cited by examiner

FIG. 11D

| Sensing Result Value ||
|---|---|
| Case1 | Case2 |
| 00 | 01 |

Table_1

FIG. 14F

| Sensing Result Value | | | | Table_2 |
|---|---|---|---|---|
| Case1 | Case2 | Case3 | Case4 | |
| 000 | 001 | 011 | 111 | |

FIG. 16B

| Sensing Result Value | | | | | | | |
|---|---|---|---|---|---|---|---|
| Case1 | Case2 | Case3 | Case4 | Case5 | Case6 | Case7 | Case8 |
| 0000000 | 0000001 | 0000011 | 0000111 | 0001111 | 0011111 | 0111111 | 1111111 |

Table_3

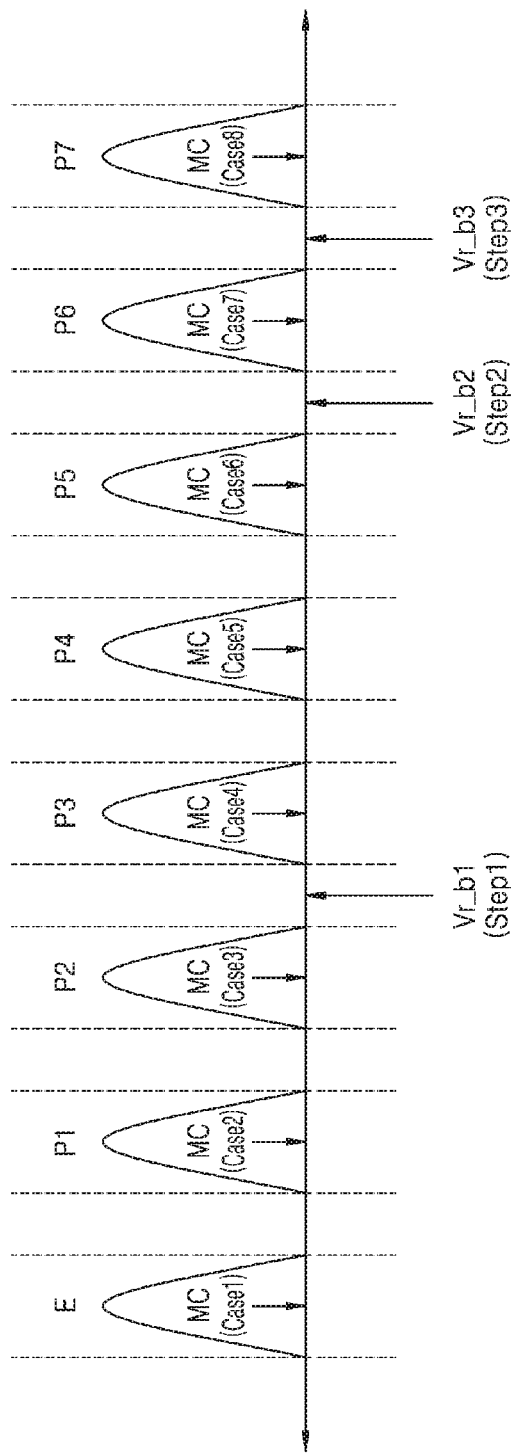

FIG. 17B

Table_4

| Step | Sensing Result Value | | | | | | | |
|---|---|---|---|---|---|---|---|---|
| | Case1 | Case2 | Case3 | Case4 | Case5 | Case6 | Case7 | Case8 |
| Step1 | 000 | 001 | 011 | 111 | 111 | 111 | 111 | 111 |
| Step2 | – | – | – | 000 | 001 | 011 | 111 | 111 |
| Step3 | – | – | – | – | – | – | 011 | 111 |

PAGE BUFFER, A MEMORY DEVICE INCLUDING THE SAME AND A READ OPERATION METHOD THEREOF

CROSS-REFERENCE TO RELATED APPLICATION

This application claims priority under 35 U.S.C. § 119 to Korean Patent Application No. 10-2016-0153315, filed on Nov. 17, 2016, in the Korean Intellectual Property Office, the disclosure of which is incorporated by reference herein in its entirety.

TECHNICAL FIELD

The inventive concept relates to a memory device, and more particularly, to a memory device including a page buffer and a read operation method of the memory device.

DISCUSSION OF RELATED ART

Memory devices are used for storing data and may be classified as volatile memory devices or nonvolatile memory devices. Nonvolatile memory devices can retrieve stored information even after having been powered cycled (e.g., turned off and back on). A flash memory device is an example of a nonvolatile memory device. A flash memory device may be used in a cellular phone, a digital camera, a personal digital assistant (PDA), a mobile computer device, a stationary computer device, etc.

A nonvolatile memory device may sense a voltage of a sensing node to sense data of a memory cell included in the nonvolatile memory device. When the nonvolatile memory device senses the voltage of the sensing node, control signals are applied to each of a plurality of page buffers to control the sensing of the voltage of the sensing node. However, when the control signals are transitioned, they require a time for their levels to be stabilized. Consequently, this contributes to the time needed to sense data. In addition, a transition speed of the control signals to a target level may be different for each of the page buffers. Therefore, there may be a difference in sensing characteristics of the page buffers, which can deteriorate the reliability of a data sense operation.

SUMMARY

According to an exemplary embodiment of the inventive concept, there is provided a page buffer including a pre-charge unit for pre-charging a bit line of a selected memory cell of a memory cell array via a first pre-charge line and pre-charging a sensing node via a second pre-charge line, during a pre-charge time, a bit line connection unit connected between the bit line and the sensing node and including a connecting node connected to the first pre-charge line, the bit line connection unit controlling a voltage of the sensing node, during a develop time, based on a bit line connection control signal and a sensing node voltage control signal, and a data input and output unit for generating sensing data by sensing a level of the voltage of the sensing node, during a sensing time.

According to an exemplary embodiment of the inventive concept, there is provided a memory device including a memory cell array including a plurality of memory cells, a page buffer connected to a bit line of a selected memory cell of the memory cell array, and a control logic for controlling a data sensing operation of the page buffer, wherein the page buffer includes a pre-charge unit for pre-charging the bit line and a plurality of sensing nodes, during a pre-charge time, a bit line connection unit connected between the bit line and the plurality of sensing nodes and including a connecting node connected to the pre-charge unit, the bit line connection unit controlling voltages of the plurality of sensing nodes, during a develop time, based on a bit line connection control signal and a plurality of sensing node voltage control signals, each being received from the control logic, and a plurality of data input and output units for generating a plurality of pieces of sensing data by sensing levels of the voltages of corresponding sensing nodes from among the plurality of sensing nodes.

According to an exemplary embodiment of the inventive concept, there is provided a reading method of a memory device including a memory cell array including a plurality of memory cells, and a page buffer, the reading method including applying a bit line connection control signal having a first level to a bit line connection transistor of the page buffer connected to a bit line of a memory cell selected to have a read operation performed thereon from among the plurality of memory cells, and applying a first sensing node voltage control signal having a second level to a first sensing node connection transistor of the page buffer connected to a first sensing node, pre-charging the bit line by forming a first pre-charge path and pre-charging the first sensing node by forming a second pre-charge path, during a pre-charge time period, controlling a voltage of the first sensing node, during a develop time period, based on a voltage of the bit line, the first sensing node voltage control signal, and a threshold voltage of the first sensing node connection transistor, and sensing a level of the voltage of the first sensing node, during a sensing time period.

According to an exemplary embodiment of the inventive concept, there is provided a page buffer including a pre-charge unit configured to pre-charge a bit line via a first pre-charge path, and to pre-charge a sensing node to a pre-charge voltage via a second pre-charge path; a bit line connection unit including a bit line connection transistor and a sensing node connection transistor connected in series between the bit line and the sensing node, a first terminal of the bit line connection transistor is connected to the first pre-charge path, and a first terminal of the sensing node connection transistor is connected to the second pre-charge path; and a data input and output unit configured to sense a level of a voltage at the sensing node.

BRIEF DESCRIPTION OF THE DRAWINGS

The above and other features of the inventive concept will be more clearly understood by describing in detail exemplary embodiments thereof with reference to the accompanying drawings in which:

FIG. 11D is a diagram for describing a method of determining read data of a memory cell according to an exemplary embodiment of the inventive concept;

FIG. 14F is a diagram for describing a method of determining read data of a memory cell according to an exemplary embodiment of the inventive concept;

FIG. 16B is a diagram for describing a method of determining read data of a memory cell according to an exemplary embodiment of the inventive concept;

FIG. 17A is a diagram showing a threshold voltage distribution of memory cells for describing an operation of the page buffer of FIG. 13;

FIG. 17B is a diagram for describing a method of determining read data of a memory cell according to an exemplary embodiment of the inventive concept;

DETAILED DESCRIPTION OF THE EMBODIMENTS

Figure 1:
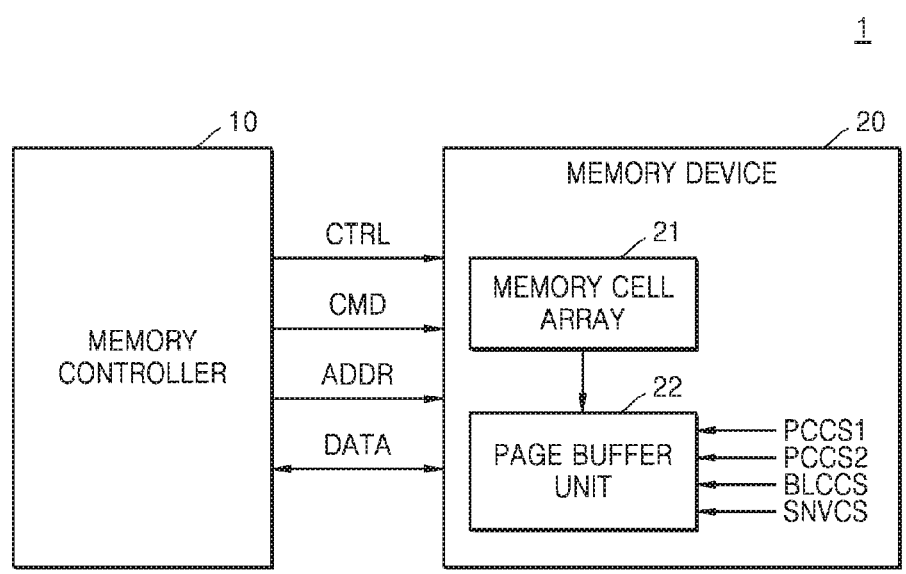
FIG. 1 is a schematic block diagram of a memory system according to an exemplary embodiment of the inventive concept.

Hereinafter, exemplary embodiments of the present inventive concept will be described in detail by referring to the accompanying drawings. In the drawings, like reference numerals may refer to like elements.

FIG. 1 is a schematic block diagram of a memory system 1 according to an exemplary embodiment of the inventive concept.

Referring to FIG. 1, the memory system 1 may include a memory controller 10 and a memory device 20. The memory device 20 may include a memory cell array 21 and a page buffer unit 22. The memory controller 10 may perform a control operation with respect to the memory device 20. For example, the memory controller 10 may control program (or write), read, and erase operations with respect to the memory device 20 by providing an address ADDR, a command CMD and a control signal CTRL to the memory device 20.

The memory cell array 21 may include a plurality of memory cells arranged in areas in which a plurality of word lines and a plurality of bit lines intersect each other. According to an exemplary embodiment of the inventive concept, the plurality of memory cells may be flash memory cells, and the memory cell array 21 may be a NAND flash memory cell array or a NOR flash memory cell array. Hereinafter, exemplary embodiments of the present inventive concept will be described for the case where the plurality of memory cells are NAND flash memory cells. However, the present inventive concept is not limited thereto. For example, the plurality of memory cells may be resistive memory cells, such as resistive random access memory (RRAM), phase change random access memory (PRAM), or magnetic random access memory (MRAM).

In addition, according to an exemplary embodiment of the present inventive concept, the memory cell array 21 may be a three-dimensional (3D) memory array. The 3D memory array is formed monolithically on at least one physical level of memory cell arrays having an active area arranged on a silicon substrate, and circuitry related to an operation of memory cells. The associated circuitry may be formed on or in the substrate. The term "monolithically" may denote that layers of each level of the memory cell array are directly deposited on the layers of each respective underlying level of the memory cell array. According to an exemplary embodiment of the present inventive concept, the 3D memory array includes NAND strings which are arranged in a perpendicular direction to the substrate and in an order such that at least one memory cell of a NAND string is arranged above another memory cell of that NAND string. The at least one memory cell may include a charge trap layer. U.S. Pat. Nos. 7,679,133, 8,553,466, 8,654,587, 8,559,235, and U.S. Patent Application Publication No. 2011/0233648 disclose elements of a 3D memory array that is formed as a plurality of levels, wherein each level shares word lines and/or bit lines. The aforementioned patent documents are incorporated by reference herein in their entireties. U.S. Patent Application Publication No. 2014-0334232 and U.S. Pat. No. 8,488,381 are also incorporated by reference herein in their entireties.

The page buffer unit 22 may temporarily store data which is to be written to the memory cell array 21 or data which is read from the memory cell array 21. The page buffer unit 22 according to an exemplary embodiment may include a plurality of page buffers, and the number of the page buffers may correspond to the number of a plurality of bit lines. For example, when a read operation with respect to the memory device 20 is performed, each of the page buffers included in the page buffer unit 22 may receive a first pre-charge control signal PCCS1, a second pre-charge control signal PCCS2, a bit line connection control signal BLCCS, and a sensing node voltage control signal SNVCS. According to an exemplary embodiment of the inventive concept, during a sensing operation with respect to a voltage of a sensing node, the bit line connection control signal BLCCS may maintain a first level and the sensing node voltage control signal SNVCS may maintain a second level. For example, the first level and the second level may be different from each other. In addition, the first level may be greater than the second level. The bit line connection control signal BLCCS and the sensing node voltage control signal SNVCS may maintain a certain level during a pre-charge section and a develop section with respect to the sensing node.

The page buffer may pre-charge a bit line corresponding to the page buffer in response to the first pre-charge control signal PCCS1 and pre-charge the sensing node in response to the second pre-charge control signal PCCS2. According to an exemplary embodiment of the inventive concept, when the page buffer performs the pre-charge operation, a path for pre-charging the bit line and a path for pre-charging the sensing node may be different. Further, the page buffer may perform the pre-charge operations with respect to the bit line and the sensing node at different voltages. The page buffer may control a voltage of the sensing node during the develop section based on the bit line connection control signal BLCCS and the sensing node voltage control signal SNVCS. For example, the page buffer may discharge the sensing node when a voltage of the bit line drops to a voltage that is equal to or lower than a predetermined voltage, in the develop section. The predetermined voltage may be determined based on a characteristic of the page buffer and the sensing node voltage control signal SNVCS. This feature will be described in detail later. After the develop section, the page buffer may determine data of a memory cell by sensing a level of the voltage of the sensing node during the sensing section, and output the data via the memory controller 10.

As described above, when the memory device 20 performs a read operation with respect to a memory cell, the memory device 20 may sense the level of the voltage of the sensing node by using the bit line connection control signal BLCCS and the sensing node voltage control signal SNVCS. It is to be understood that each of the bit line connection control signal BLCCS and the sensing node voltage control signal SNVCS has a certain level during a predetermined section. Thus, a reading speed and the reliability of the read operation of the memory device 20 may be increased.

Figure 2:
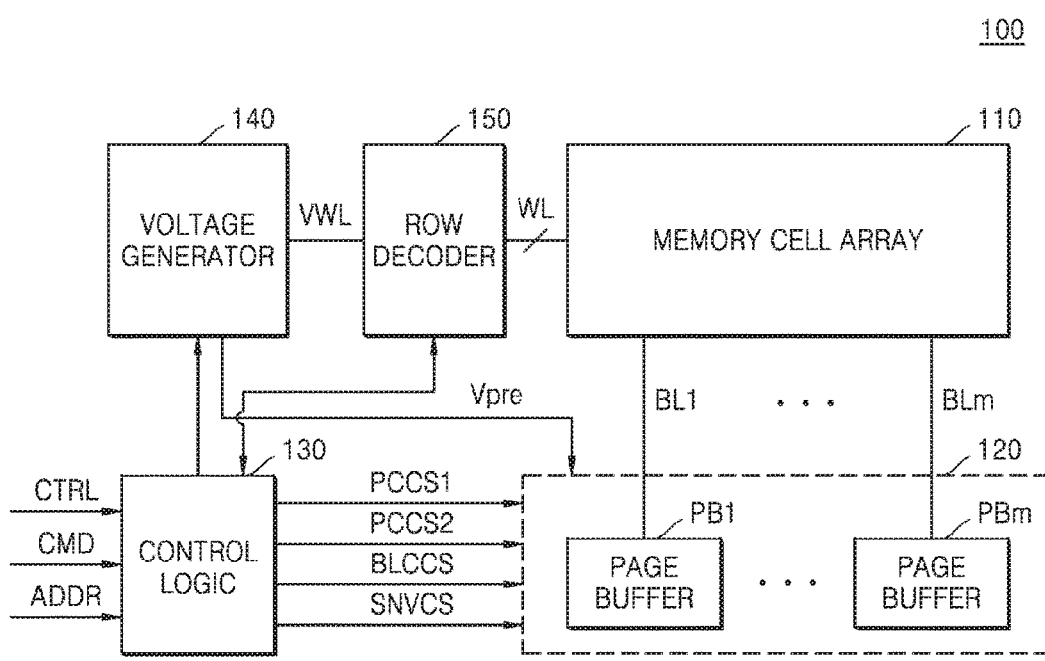
FIG. 2 is a detailed block diagram of a memory device included in the memory system of FIG. 1 according to an exemplary embodiment of the inventive concept.

FIG. 2 is a detailed block diagram of a memory device 100 included in the memory system 1 of FIG. 1 according to an exemplary embodiment of the inventive concept.

Referring to FIG. 2, the memory device 100 may include a memory cell array 110, a page buffer unit 120, a control logic 130, a voltage generator 140, and a row decoder 150. The control logic 130 may output various control signals for writing data to the memory cell array 110 or reading data from the memory cell array 110, based on a command CMD, an address ADDR, and a control signal CTRL received from the memory controller 10. Here, various control signals that are output from the control logic 130 may be transmitted to the voltage generator 140, the row decoder 150, and the page buffer unit 120.

The voltage generator 140 may generate a driving voltage VWL for driving a plurality of word lines WL based on a control signal received from the control logic 130. For example, the driving voltage VWL may be a write voltage (or a program voltage), a read voltage, an erase voltage, or a pass voltage. The voltage generator 140 may provide a pre-charge voltage Vpre to the page buffer unit 120. According to an exemplary embodiment of the inventive concept, the voltage generator 140 may provide the pre-charge voltage Vpre having various voltage levels to page buffers PB1 through PBm.

The row decoder 150 may activate some of the plurality of word lines WL based on a row address. For example, during a read operation, the row decoder 150 may apply a read voltage to a selected word line and apply a pass voltage to non-selected word lines. During a write operation, the row decoder 150 may apply a write voltage to a selected word line and apply a pass voltage to non-selected word lines.

The page buffer unit 120 may include the plurality of page buffers PB1 through PBm. The page buffer unit 120 may be connected to the memory cell array 110 via a plurality of bit lines BL1 through BLm. For example, during a read operation, the page buffer unit 120 may operate as a sense amplifier and output data stored to the memory cell array 110. Each of the page buffers PB1 through PBm may receive a pre-charge voltage Vpre from the voltage generator 140 and receive a first pre-charge control signal PCCS1 and a second pre-charge control signal PCCS2 from the control logic 130 to perform a pre-charge operation via various pre-charge paths. In addition, the page buffers PB1 through PBm may receive a bit line connection control signal BLCCS and a sensing node voltage control signal SNVCS from the control logic 130 and control a voltage of a sensing node in a develop section. The received bit line connection control signal BLCCS and the sensing node voltage control signal SNVCS may have certain levels during a predetermined section. During a write operation, the page buffer unit 120 may operate as a write driver and input data that is to be stored to the memory cell array 110.

Figure 3:
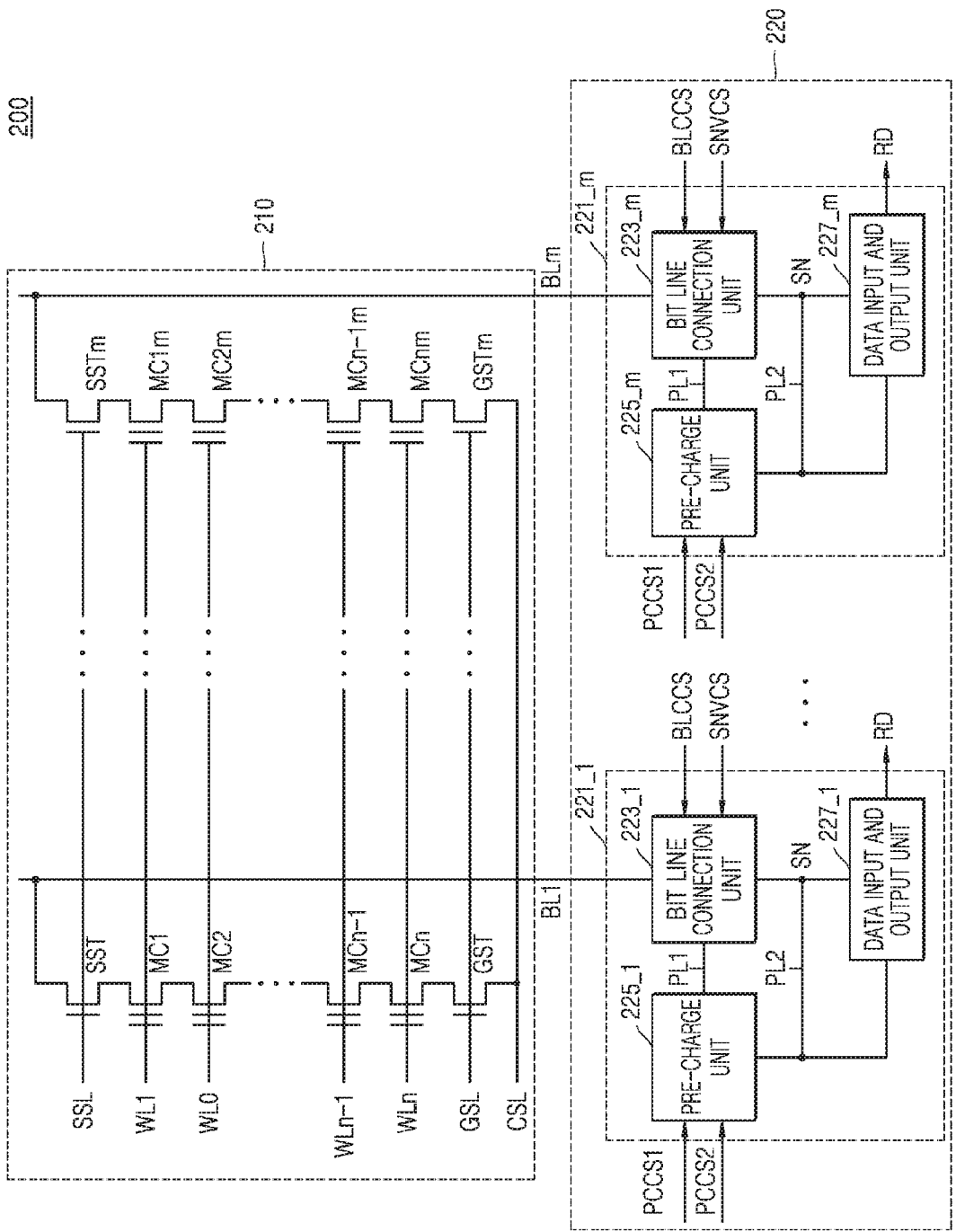
FIG. 3 is a diagram of the memory device of FIG. 2, according to an exemplary embodiment of the inventive concept.

FIG. 3 is a diagram of the memory device 100 of FIG. 2, according to an exemplary embodiment of the inventive concept.

Referring to FIG. 3, a memory device 200 may include a memory cell array 210 and a page buffer unit 220. The memory cell array 210 included in the memory device 200 may be a NAND flash memory cell array. Referring to FIG. 3, the memory cell array 210 may include string selection transistors SST through SSTm, a plurality of memory cells MC1 through MCnm, and ground selection transistors GST through GSTm. A plurality of memory cells MC1 through MCn may be connected between the string selection transistor SST and the ground selection transistor GST, a plurality of memory cells MC1m through MCnm may be connected between the string selection transistors SSTm and the ground selection transistor GSTm, and a control gate of each of the plurality of memory cells MC1 through MCn and MC1m through MCnm may be connected to each corresponding one of a plurality of word lines WL1 through WLn.

First terminals of the string selection transistors SST through SSTm may be connected to corresponding bit lines BL1 through BLm, and gate terminals of the string selection transistors SST through SSTm may be connected to a string selection line SSL. In addition, second terminals of the ground selection transistors GST through GSTm may be connected to a common source line CSL, and gate terminals of the ground selection transistors GST through GSTm may be connected to a ground selection line GSL. One string selection transistor SST, one ground selection transistor GST, and the plurality of memory cells MC1 through MCn connected therebetween may be referred to as a string.

The page buffer unit 220 may include a plurality of page buffers 221_1 through 221_m corresponding to the plurality of bit lines BL1 through BLm, respectively. The page buffers 221_1 through 221_m may include bit line connection units 223_1 through 223_m, pre-charge units 225_1 through 225_m, and data input and output units 227_1 through 227_m. The bit line connection units 223_1 through 223_m may be connected between a sensing node SN and the bit lines BL1 through BLm corresponding to the page buffers 221_1 through 221_m. The bit line connection units 223_1 through 223_m may be electrically connected to the bit lines BL1 through BLm, respectively, based on a bit line connection control signal BLCCS. An operation of reading data of the memory cells MC1 through MCn and MC1m through MCnm may go through a pre-charge section in which the bit lines BL1 through BLm and the sensing node SN are pre-charged, a develop section in which the bit lines BL1 through BLm and the sensing node SN are developed, and a sensing section in which a level of a voltage of the sensing node SN is sensed.

According to an exemplary embodiment of the inventive concept, the pre-charge units 225_1 through 225_m may be connected to the bit line connection units 223_1 through 223_m via a first pre-charge line PL1 and may be connected to the sensing node SN via a second pre-charge line PL2. The pre-charge units 225_1 through 225_m may pre-charge the bit lines BL1 through BLm via the bit line connection units 223_1 through 223_m in response to the first pre-charge control signal PCCS1. In addition, the pre-charge units 225_1 through 225_m may pre-charge the sensing node SN in response to the second pre-charge control signal PCCS2. According to an exemplary embodiment of the inventive concept, the bit lines BL1 through BLm may be pre-charged to a pre-charge voltage corresponding to the bit line connection control signal BLCCS. After the pre-charge operations are performed, voltages of the bit lines BL1 through BLm may be changed during the develop section, depending on whether a memory cell connected to each of the bit lines BL1 through BLm is programmed or not.

For example, when each of the memory cells is a single level cell, and the memory cell that is connected to the first bit line BL1 and selected as an object to which a read operation is to be performed, is not programmed, the memory cell may be an on cell. Thus, charges pre-charged in the first bit line BL1 may be discharged to the common source line CSL through a channel of the memory cell so that the voltage of the first bit line BL1 may decrease. On the contrary, when the memory cell that is selected as an object to which a read operation is to be performed, is programmed, the memory cell may be an off cell. Thus, charges pre-charged in the first bit line BL1 may not be discharged to the common source line CSL through the channel of the memory cell. Thus, a drop of the voltage of the first bit line BL1 may be relatively small. As another example, when each of the memory cells is a multi-level cell, a degree in which charges pre-charged in the first bit line BL1 are discharged to the common source line CSL varies depending on whether the memory cell that is connected to the first bit line BL1 and selected as an object for a read operation, is programmed or not. Thus, a degree in which the voltage of the first bit line BL1 drops may be different depending on whether the memory cell is programmed or not.

According to an exemplary embodiment of the present inventive concept, the bit line connection units 223_1 through 223_m may control the voltage of the sensing node SN during the develop section based on a sensing node voltage control signal SNVCS. For example, the bit line connection units 223_1 through 223_m may control the sensing node SN to be discharged when a voltage of the bit lines BL1 through BLm drops to a voltage that is equal to or lower than a predetermined voltage. The pre-determined voltage may be determined based on a characteristic of the bit line connection units 223_1 through 223_m and the sensing node voltage control signal SNVCS.

The data input and output units 227_1 through 227_m may read data RD of a selected memory cell by sensing a level of a voltage of the sensing node SN to which the data input and output units 227_1 through 227_m are connected, or may output data that is input from the outside via the bit line connection units 223_1 through 223_m via the sensing node SN.

Figure 4:
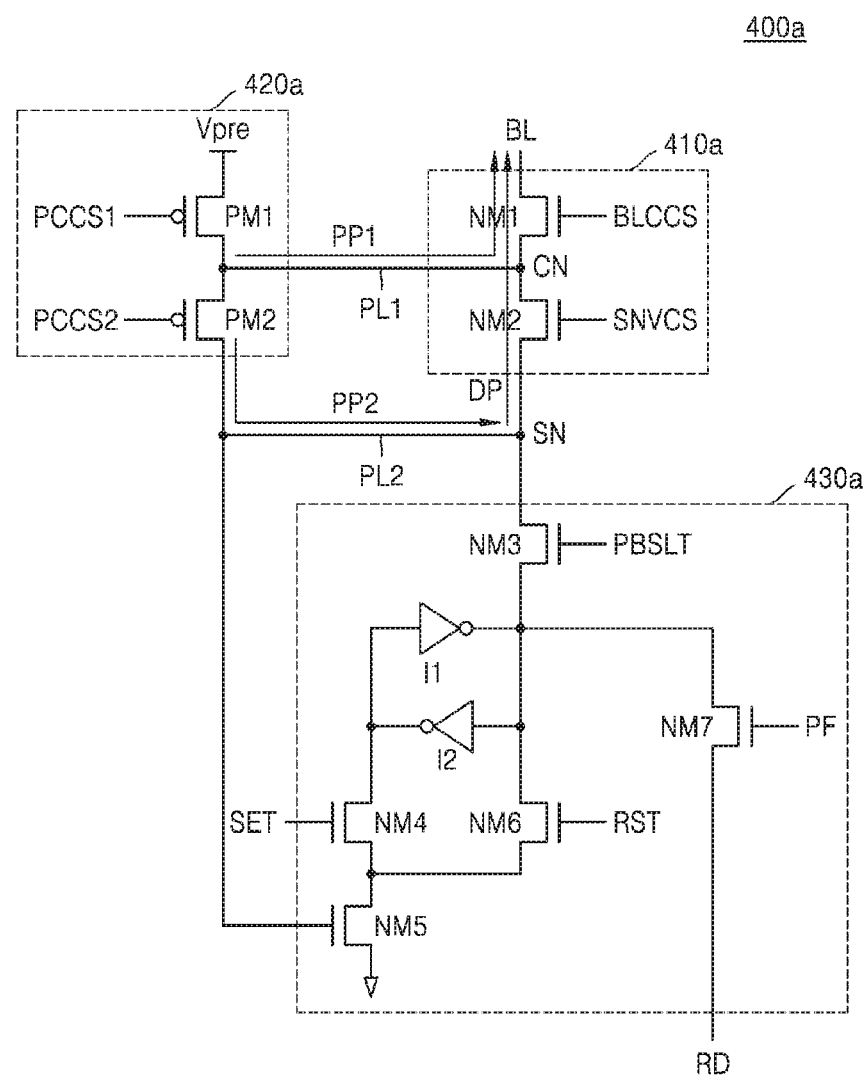
FIG. 4 is a diagram of a page buffer of FIG. 3, according to an exemplary embodiment of the inventive concept.

FIG. 4 is a diagram of the page buffers 221_1 through 221_m of FIG. 3, according to an exemplary embodiment of the inventive concept.

Referring to FIG. 4, a page buffer 400a may include a bit line connection unit 410a, a pre-charge unit 420a, and a data input and output unit 430a. The bit line connection unit 410a, the pre-charge unit 420a, and the data input and output unit 430a illustrated in FIG. 4 may be an example of the bit line connection units 223_1 through 223_m, the pre-charge units 225_1 through 225_m, and the data input and output units 227_1 through 227_m of FIG. 3.

The bit line connection unit 410a may include a bit line connection transistor NM1 and a sensing node connection transistor NM2 connected in series between a bit line BL and a sensing node SN. A gate terminal of the bit line connection transistor NM1 may receive a bit line connection control signal BLCCS, a first terminal of the bit line connection transistor NM1 may be connected to a connecting node CN, and a second terminal of the bit line connection transistor NM1 may be connected to the bit line BL. The connecting node CN may be a node that is connected to the first terminal of the bit line connection transistor NM1 and a second terminal of the sensing node connection transistor NM2. On/off of the bit line connection transistor NM1 may be controlled via the bit line connection control signal BLCCS. The bit line connection transistor NM1 directly connected to the bit line BL may be a high voltage transistor. A gate terminal of the sensing node connection transistor NM2 may receive a sensing node voltage control signal SNVCS, a first terminal of the sensing node connection transistor NM2 may be connected to the sensing node SN, and the second terminal of the sensing node connection transistor NM2 may be connected to the connecting node CN. On/off of the sensing node connection transistor NM2 may be controlled via the sensing node voltage control signal SNVCS.

The pre-charge unit 420a may include a first pre-charge transistor PM1 and a second pre-charge transistor PM2. A gate terminal of the first pre-charge transistor PM1 may receive a first pre-charge control signal PCCS1, a first terminal of the first pre-charge transistor PM1 may receive a pre-charge voltage Vpre, and a second terminal of the first pre-charge transistor PM1 may be connected to a first terminal of the second pre-charge transistor PM2. A gate terminal of the second pre-charge transistor PM2 may receive a second pre-charge control signal PCCS2, the first terminal of the second pre-charge transistor PM2 may be connected to the second terminal of the first pre-charge transistor PM1, and a second terminal of the second pre-charge transistor PM2 may be connected to the sensing node SN.

According to an exemplary embodiment of the present inventive concept, the second terminal of the first pre-charge transistor PM1 may be connected to the connecting node CN via a first pre-charge line PL1, and the first pre-charge transistor PM1 may pre-charge the bit line BL by forming a first pre-charge path PP1 in response to the first pre-charge control signal PCCS1. The first pre-charge transistor PM1 may pre-charge the bit line BL based on the bit line connection control signal BLCCS, and a threshold voltage of a bit line connection transistor NM1. For example, the first pre-charge transistor PM1 may pre-charge the bit line BL to a voltage that is obtained by subtracting the threshold voltage of the bit line connection transistor NM1 from the bit line connection control signal BLCCS. In other words, a level of the voltage to which the bit line BL is pre-charged may vary according to a characteristic of the bit line connection transistor NM1.

The second terminal of the second pre-charge transistor PM2 may be connected to the sensing node SN via a second pre-charge line PL2, and the second pre-charge transistor PM2 may pre-charge the sensing node SN to a pre-charge voltage Vpre by forming a second pre-charge path PP2 in response to the second pre-charge control signal PCCS2.

As described above, after the bit line BL and the sensing node SN are pre-charged, the sensing node connection transistor NM2 may control a voltage of the sensing node SN based on a threshold voltage of the sensing node connection transistor NM2, a voltage of the bit line BL, and the sensing node voltage control signal SNVCS, in a develop section. For example, when a voltage that is obtained by subtracting the developed voltage of the bit line BL from a voltage of the sensing node voltage control signal SNVCS is equal to or higher than the threshold voltage of the sensing node connection transistor NM2, the sensing node connection transistor NM2 may discharge the sensing node SN by forming a discharge path DP. On the contrary, when the voltage that is obtained by subtracting the developed voltage of the bit line BL from the voltage of the sensing node voltage control signal SNVCS is lower than the threshold voltage of the sensing node connection transistor NM2, the sensing node connection transistor NM2 may not form the discharge path DP, and a level of the voltage of the sensing node SN may be maintained.

The data input and output unit 430a may include third through seventh transistors NM3 through NM7 and first and second inverters I1 and I2. The inverters may be latch units I1 and I2 that are configured to store data of a memory cell that is selected as an object to which a read operation is to be performed, by sensing the level of the voltage of the sensing node SN, in response to a latch set signal SET (applied to NM4, for example). The first and second inverters I1 and I2 may be connected as a chain to form the latch units I1 and I2. The selected memory cell may denote a memory cell that is selected from among the plurality of memory cells MC1 through MCn and MC1m through MCnm of FIG. 3, via word lines WL1 through WLm.

The read data RD stored to the latch units I1 and I2 of the data input and output unit 430a may be output to the outside via a data output line in response to an input and output control signal PF (applied to NM7, for example). NM6 is configured to receive a reset signal RST at a gate thereof, and NM3 is configured to receive a control signal PBSLT (for example, a page buffer selection signal) at a gate thereof. The page buffer 400a illustrated in FIG. 4 is merely exemplary, and the present inventive concept is not limited thereto. The present inventive concept may include page buffers having various structures. For example, the page buffer may include a plurality of transistors. Hereinafter, an operation of the page buffer 400a of FIG. 4 will be described by referring to FIGS. 5A and 5B.

Figure 5A:
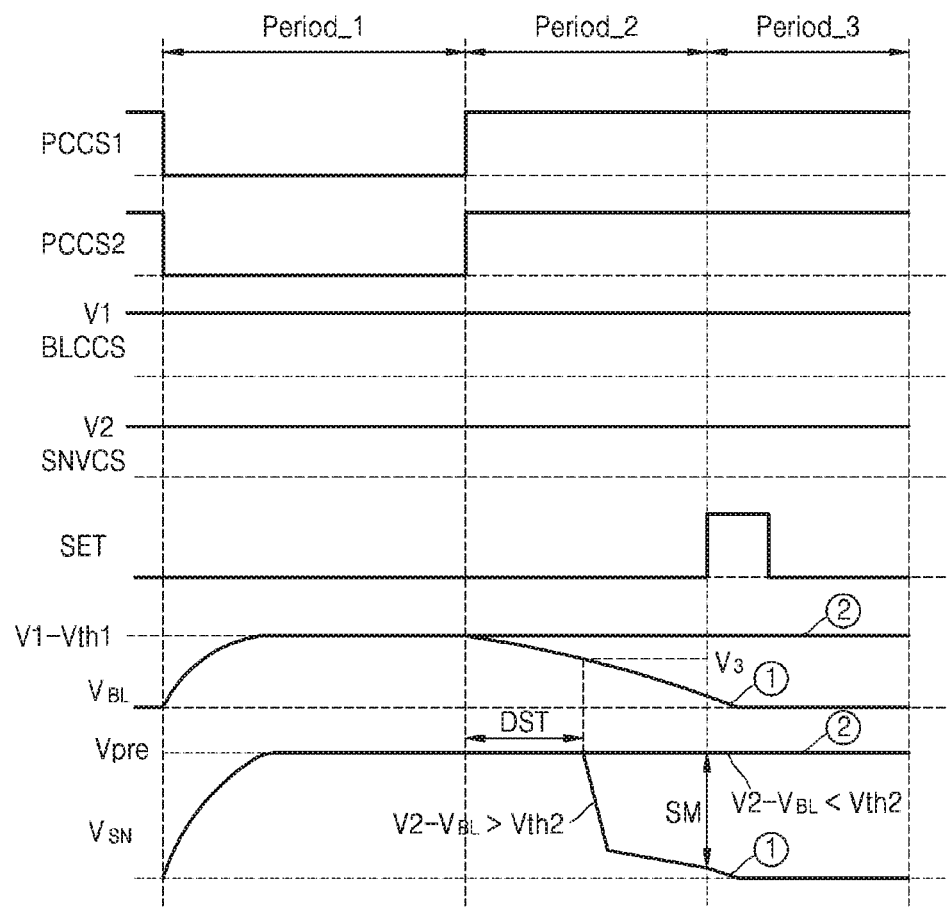
FIGS. 5A and 5B are diagrams for describing an operation of the page buffer of FIG. 4 according to an exemplary embodiment of the inventive concept.
Figure 5B:
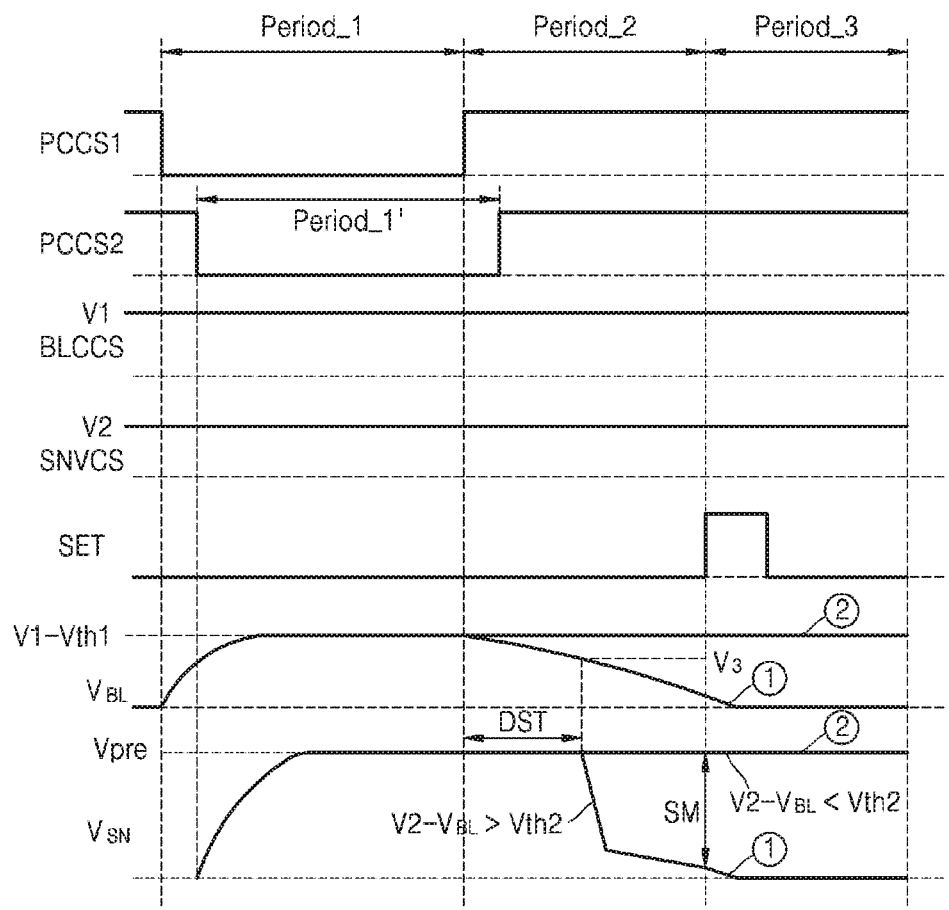

FIGS. 5A and 5B are diagrams for describing the operation of the page buffer 400a of FIG. 4 according to an exemplary embodiment of the inventive concept.

Referring to FIGS. 4 and 5A, the page buffer 400a may go through a pre-charge section Period_1, a develop section Period_2, and a sensing section Period_3, in order to sense data of a single level memory cell selected as an object to which a read operation is to be performed.

The bit line connection transistor NM1 corresponding to the bit line BL of the memory cell that is selected as the object to which the read operation is to be performed, may receive a bit line connection control signal BLCCS having a level of a voltage V1, and the sensing node connection transistor NM2 may receive a sensing node voltage control signal SNVCS having a level of a voltage V2, before the pre-charge section Period_1. The voltage V1 may be higher than the voltage V2. However, it is not limited thereto. When threshold voltages of the bit line connection transistor NM1 and the sensing node connection transistor NM2 are different from each other, the voltage V1 may be the same as the voltage V2. For example, when the threshold voltage of the bit line connection transistor NM1 is lower than the threshold voltage of the sensing node connection transistor NM2, V1 and V2 may be the same.

According to an exemplary embodiment of the inventive concept, the bit line connection control signal BLCCS and the sensing node voltage control signal SNVCS may maintain the level of the voltage V1 and the level of the voltage V2, respectively, during the pre-charge section Period_1, the develop section Period_2, and the sensing section Period_3. However, this is merely exemplary, and the present inventive concept is not limited thereto. For example, the bit line connection control signal BLCCS and the sensing node voltage control signal SNVCS may maintain the level of the voltage V1 and the level of the voltage V2, respectively, for the pre-charge section Period_1 and the develop section Period_2. Then, in the sensing section Period_3, the bit line connection control signal BLCCS and the sensing node voltage control signal SNVCS may transit to a low level. According to an exemplary embodiment of the inventive concept, the bit line connection control signal BLCCS and the sensing node voltage control signal SNVCS may have a low level before the pre-charge section Period_1, and may transit to the level of the voltage V1 and the level of the voltage V2, respectively, in the pre-charge section Period_1, and the maintain the level of the voltage V1 and the level of the voltage V2, until the sensing section Period_3.

A first pre-charge control signal PCCS1 may transit from a high level to a low level in the pre-charge section Period_1 so that the first pre-charge transistor PM1 may pre-charge the bit line BL to a voltage V1-Vth1 that is obtained by subtracting a threshold voltage Vth1 of the bit line connection transistor NM1 from the voltage V1. In addition, a second pre-charge control signal PCCS2 may transit from a high level to a low level at the same time as the first pre-charge control signal PCCS1 so that the second pre-charge transistor PM2 may pre-charge the sensing node SN to a pre-charge voltage Vpre.

In the develop section Period_2, the first pre-charge control signal PCCS1 and the second pre-charge control signal PCCS2 may transit from a low level to a high level. When the selected memory cell is not programmed in the develop section Period_2 (1), the memory cell may be an on cell and a voltage of the bit line BL may drop. When a voltage V2-$V_{BL}$ that is obtained by subtracting the voltage $V_{BL}$ of the bit line from the voltage V2 of the sensing node voltage control signal SNVCS received by the sensing node connection transistor NM2, is equal to or higher than a threshold voltage Vth2 of the sensing node connection transistor NM2, the sensing node connection transistor NM2 may discharge the sensing node SN by forming a discharge path DP. For example, when the voltage $V_{BL}$ of the bit line BL drops to a voltage that is equal to or less than a voltage V3, the sensing node SN may be discharged and a voltage $V_{SN}$ of the sensing node may drop. In other words, the sensing node connection transistor NM2 may discharge the sensing node SN after a discharge start time DST has passed from a start point of the develop section Period_2.

When the selected memory cell is programmed in the develop section Period_2 (2), the memory cell may be an off cell and the level of the voltage $V_{BL}$ of the bit line BL may be maintained. Since the voltage $V_{BL}$ of the bit line BL is maintained constant, the voltage $V_{SN}$ of the sensing node SN may be maintained constant as the level of the pre-charge voltage Vpre.

In the sensing section Period_3, the data input and output unit 430a may store data of the selected memory cell, by sensing the level of the voltage $V_{SN}$ of the sensing node SN with a first sensing margin SM, in response to a latch set signal SET that has transited from a low level to a high level. For example, when the selected memory cell is not programmed (1), the data input and output unit 430a may store the data by sensing the data as '0,' and when the selected memory cell is programmed (2), the data input and output unit 430a may store the data by sensing the data as '1.'

The memory device 200 according to the present embodiment may perform the read operation based on the bit line connection control signal BLCCS constantly maintaining the level of the voltage V1 and the sensing node voltage control signal SNVCS constantly maintaining the level of the voltage V2 during the pre-charge section Period_1 and the develop section Period_2. Thus, a signal stabilizing section that is required when a level of each of the bit line connection control signal BLCCS and the sensing node voltage control signal SNVCS transits, is not needed. Therefore, a rapid read operation is possible, and the reliability of the read operation is secured.

Referring to FIGS. 4 and 5B, levels of the first pre-charge control signal PCCS1 and the second pre-charge control signal PCCS2 may transit at different timings. For example, in the first pre-charge section Period_1, the first pre-charge control signal PCCS1 may transit from a high level to a low level, and the second pre-charge control signal PCCS2 may transit from a high level to a low level in a first pre-charge section P1', which starts after a certain time has passed from a start point of the first pre-charge section Period_1. According to an exemplary embodiment of the inventive concept, the level transiting timings of the first pre-charge control signal PCCS1 and the second pre-charge control signal PCCS2 may be controlled by the control logic 130 of FIG. 2.

This way, a timing at which the bit-line BL is pre-charged and a timing at which the sensing node SN is pre-charged may be controlled to be different from each other. Thus, power that has to be instantly provided by the voltage generator 140 of FIG. 2 may be distributed, and consequently, the load of the voltage generator 140 may be reduced.

Figure 6A:
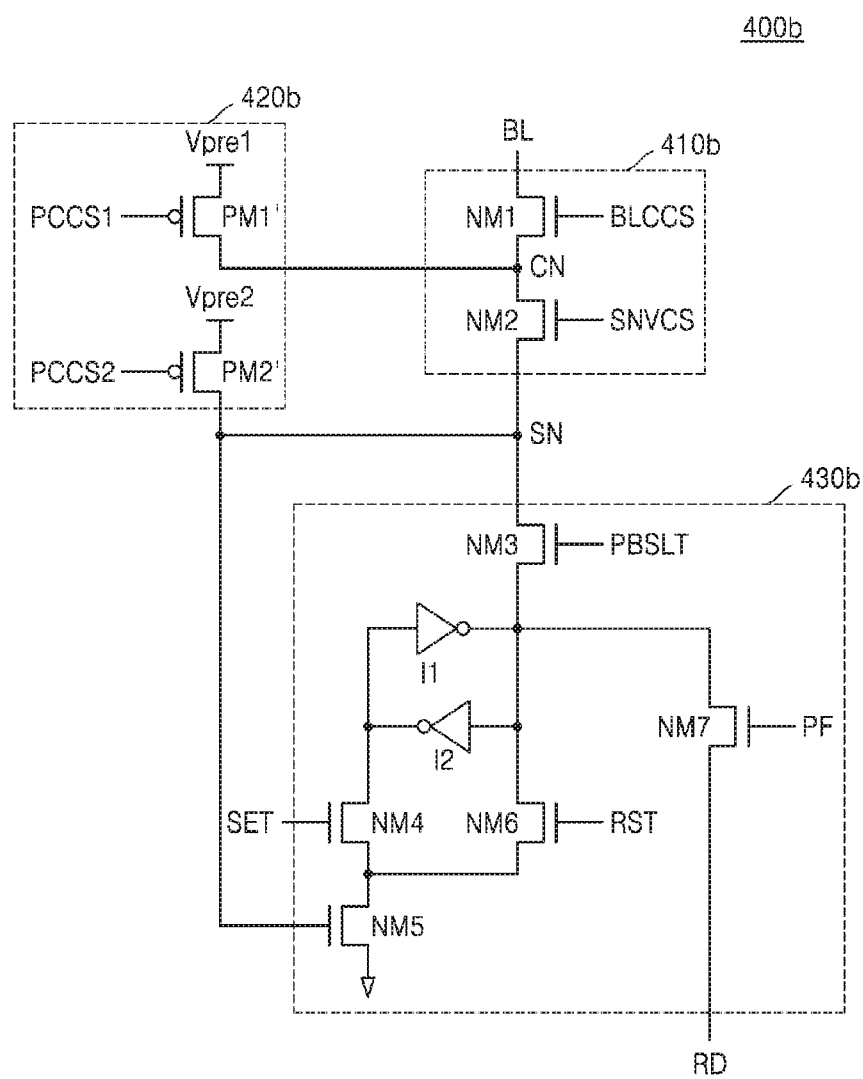
FIG. 6A is a diagram of the page buffer of FIG. 3, according to an exemplary embodiment of the inventive concept.
Figure 6B:
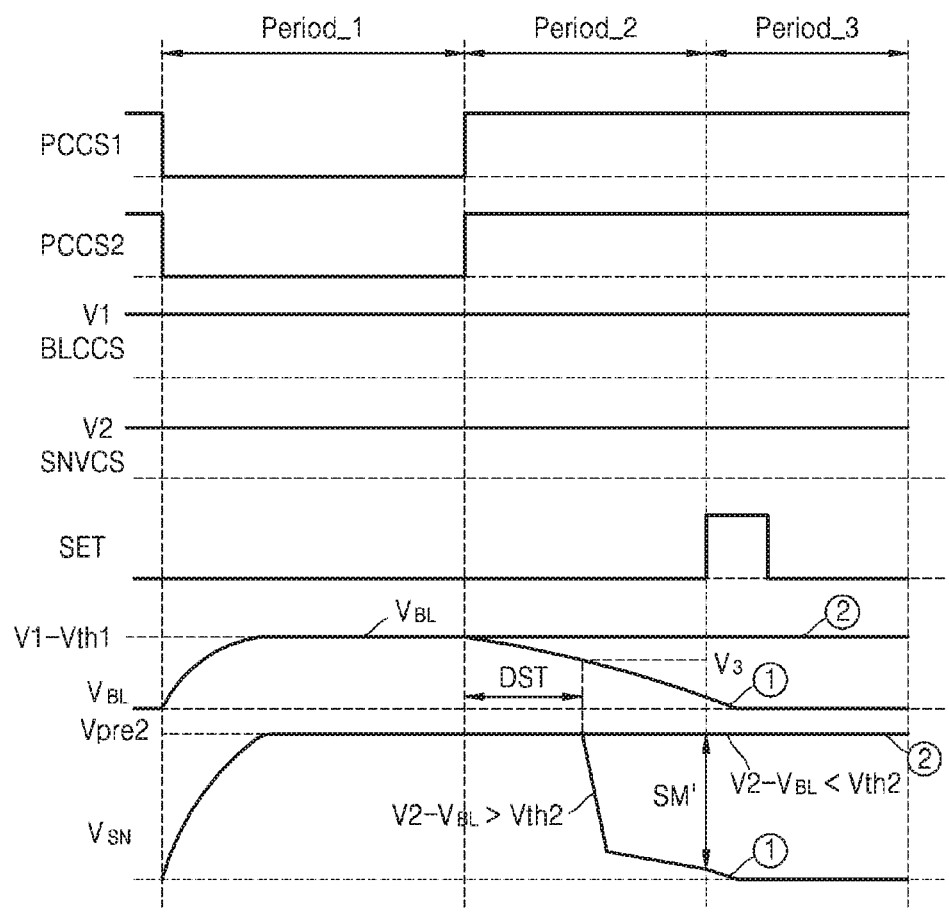
FIG. 6B is a diagram for describing an operation of the page buffer of FIG. 6A according to an exemplary embodiment of the inventive concept.

FIG. 6A is a diagram of the page buffers 221_1 through 221_m of FIG. 3, according to an exemplary embodiment of the inventive concept, and FIG. 6B is a diagram for describing an operation of a page buffer 400b of FIG. 6A according to an exemplary embodiment of the inventive concept.

Hereinafter, the page buffer 400b of FIG. 6A will be described by focusing on a structure that is different from the structure of the page buffer 400a of FIG. 4. Referring to FIG. 6A, a pre-charge unit 420b may include a first pre-charge transistor PM1' and a second pre-charge transistor PM2,' wherein the first pre-charge transistor PM1' has a first terminal receiving a first pre-charge voltage Vpre1 and a second terminal connected to only a connecting node CN. The second pre-charge transistor PM2' has a first terminal receiving a second pre-charge voltage Vpre2, separately from the first pre-charge transistor PM1'. This way, a pre-charge voltage Vpre1 that is used to pre-charge the bit line BL and a pre-charge voltage Vpre2 that is used to pre-charge the sensing node SN may be different from each other.

Referring to FIGS. 6A and 6B, according to an exemplary embodiment of the inventive concept, the second pre-charge voltage Vpre2 may be higher than the first pre-charge voltage Vpre1. Thus, a ratio of the pre-charge voltage Vpre2 of the sensing node SN to a pre-charge voltage V1-Vth1 of the bit line BL may be greater than that of FIG. 5A. Consequently, the data input and output unit 430b may perform an operation of sensing the level of the voltage VSN of the sensing node SN by having a second sensing margin SM', which is greater than the first sensing margin SM of FIG. 5A. Thus, the reliability of the read operation of the memory device 200 may be further increased.

However, this is merely exemplary. The sensing margin may be increased by applying various structures. For example, as shown in FIG. 4, the bit line BL and the sensing node SN may be pre-charged by using the same pre-charge voltage Vpre, and the threshold voltage Vth1 of the bit line connection transistor NM1 and the threshold voltage Vth2 of the sensing node connection transistor NM2 may be different. For example, the threshold voltage Vth1 of the bit line connection transistor NM1 is higher than the threshold voltage Vth2 of the sensing node connection transistor NM2.

Figure 7:
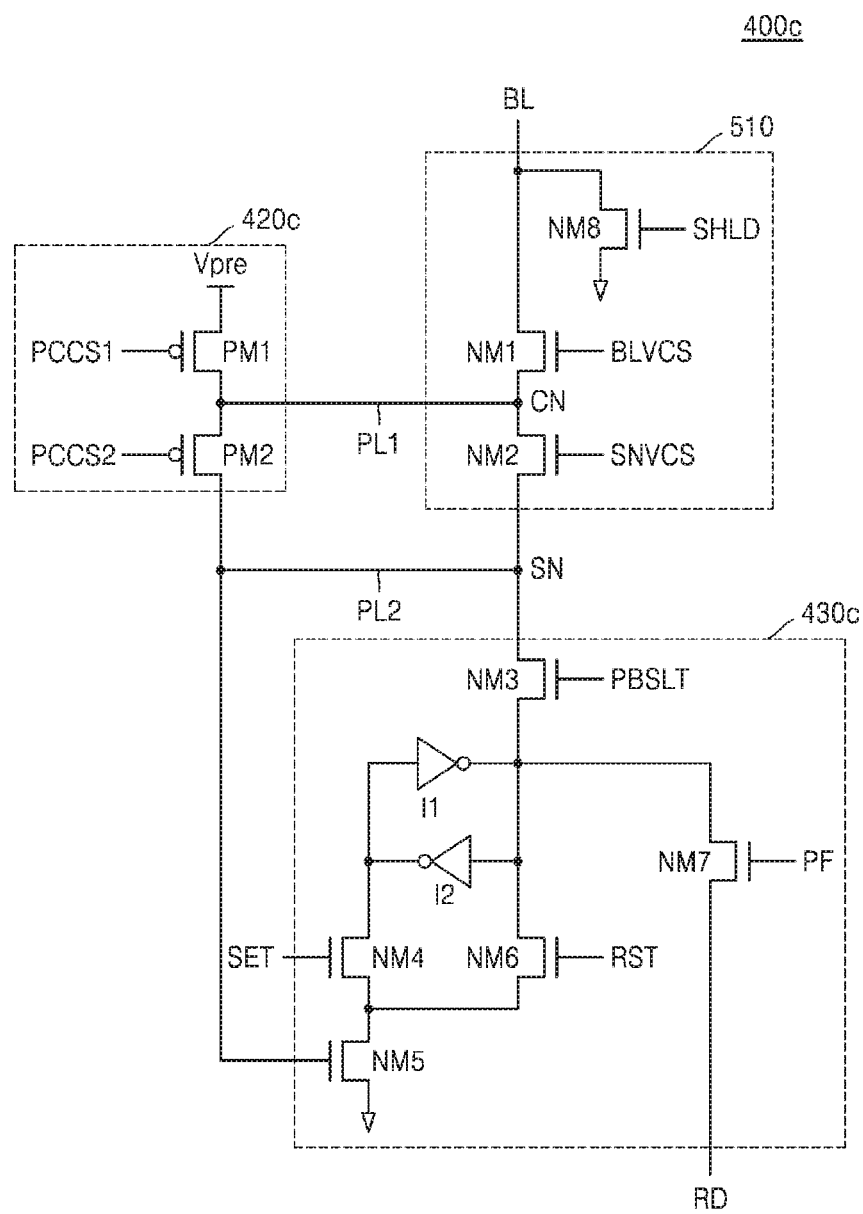
FIG. 7 is a diagram of the page buffer of FIG. 4, according to an exemplary embodiment of the inventive concept.

FIG. 7 is a diagram of the page buffer 400a of FIG. 4, according to an exemplary embodiment of the inventive concept.

Referring to FIG. 7, a page buffer 400c may include a bit line connection unit 510 that may further include a bit line voltage control transistor NM8 compared to the bit line connection unit 410a of the page buffer 400a of FIG. 4. The bit line voltage control transistor NM8 may receive a control signal SHLD and discharge the bit line BL in response to the control signal SHLD. According to an exemplary embodiment of the inventive concept, the bit line voltage control transistor NM8 may discharge the bit line BL after performing a sense operation with respect to the sensing node SN. Other configurations of the page buffer are the same as those of the page buffer 400a of FIG. 4, and thus, they will not be described. For example, pre-charge unit 420c in FIG. 7 is the same as the pre-charge unit 420a in FIG. 4, and data input and output unit 430c in FIG. 7 is the same as the data input and output unit 430a in FIG. 4.

Figure 8A:
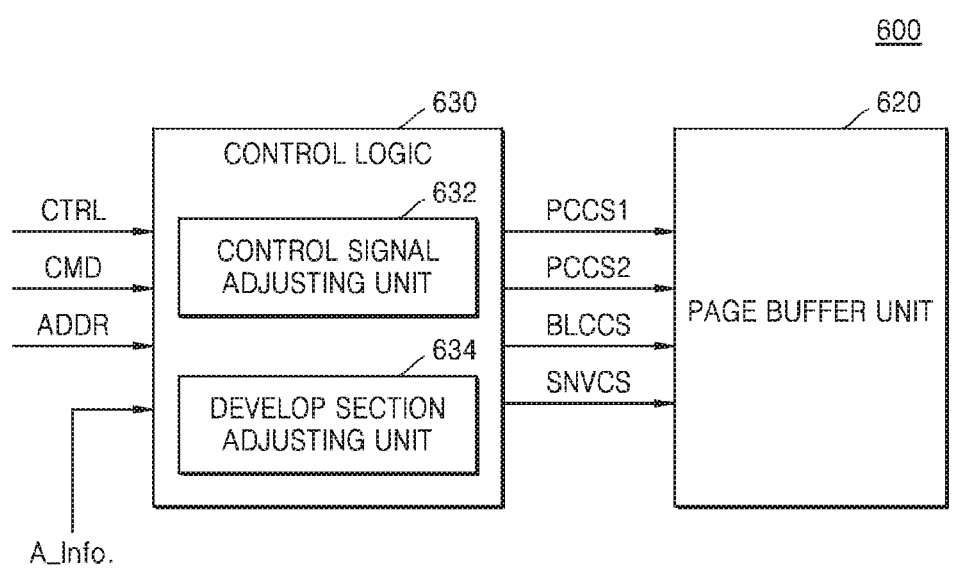
FIG. 8A is a block diagram of a memory device according to an exemplary embodiment of the inventive concept.
Figure 8B:
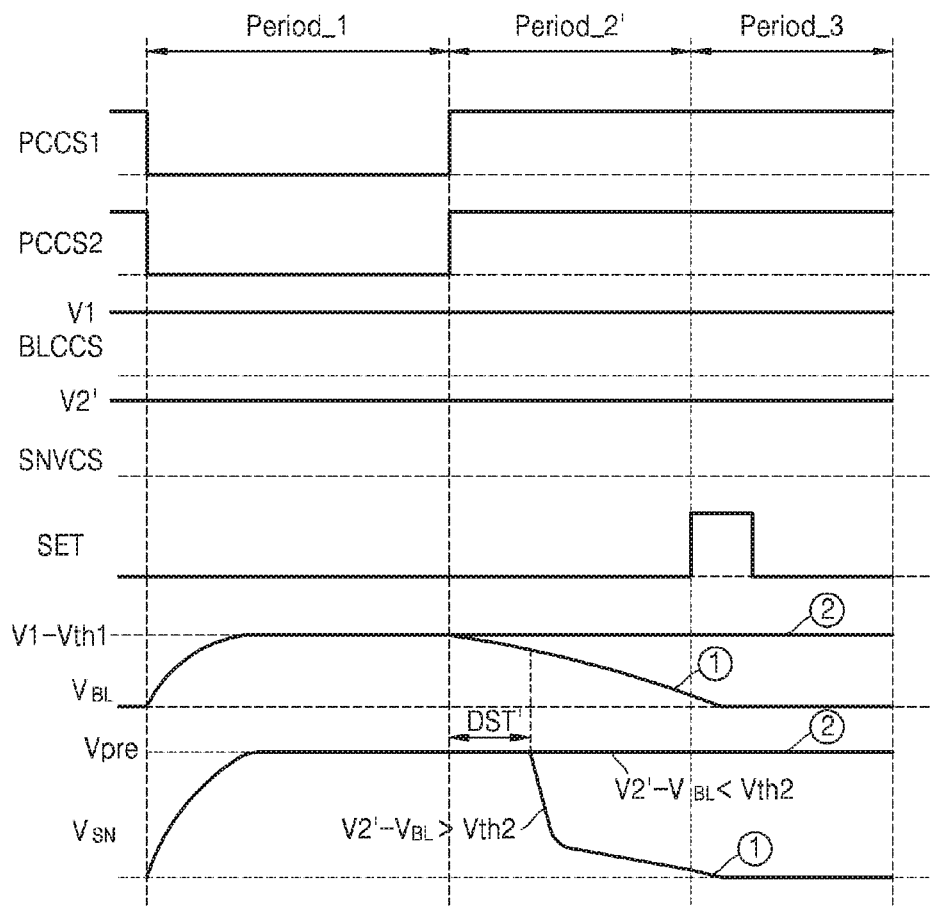
FIGS. 8B and 8C are diagrams for describing a characteristic of a threshold voltage distribution of a memory cell according to an exemplary embodiment of the inventive concept.
Figure 8C:
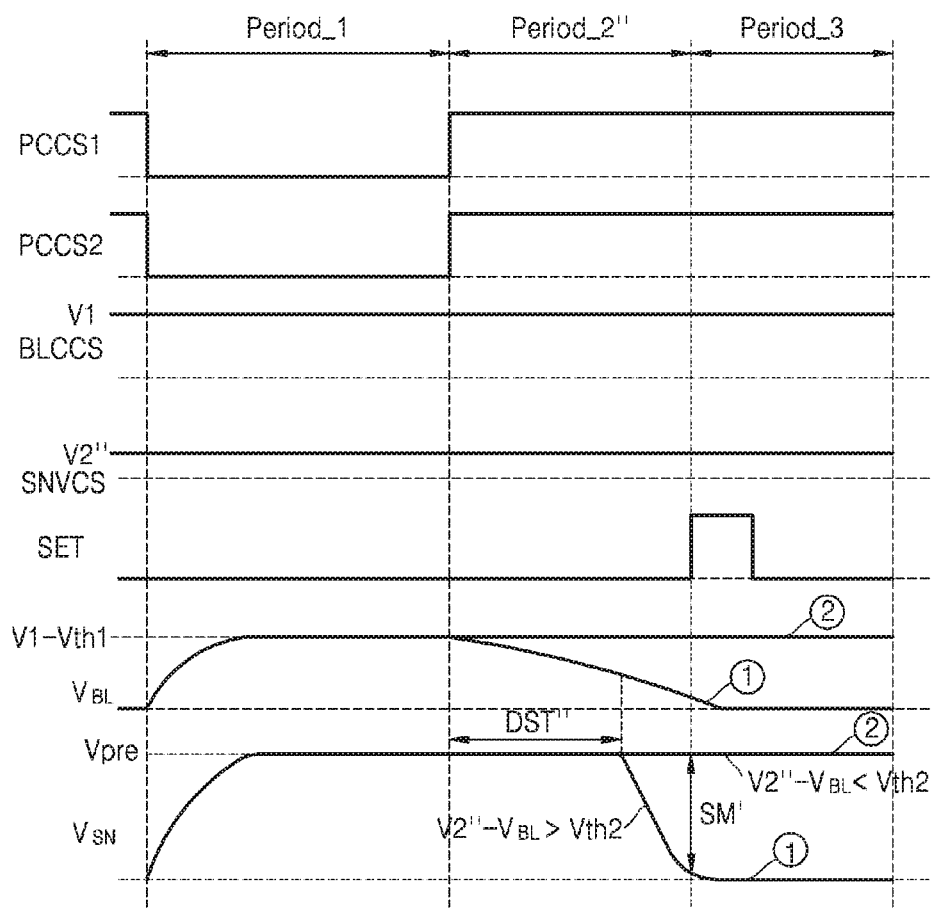
Figure 8D:
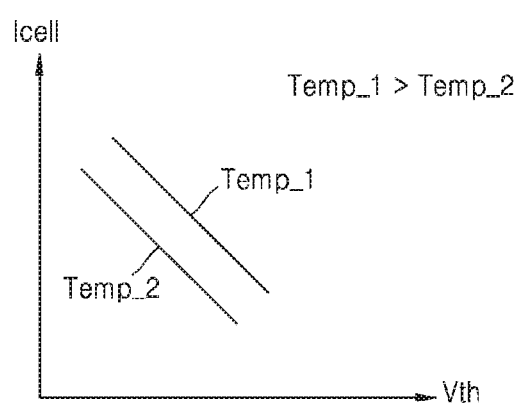
FIGS. 8D and 8E are diagrams for describing an operation of the memory device of FIG. 8A according to an exemplary embodiment of the inventive concept.
Figure 8E:
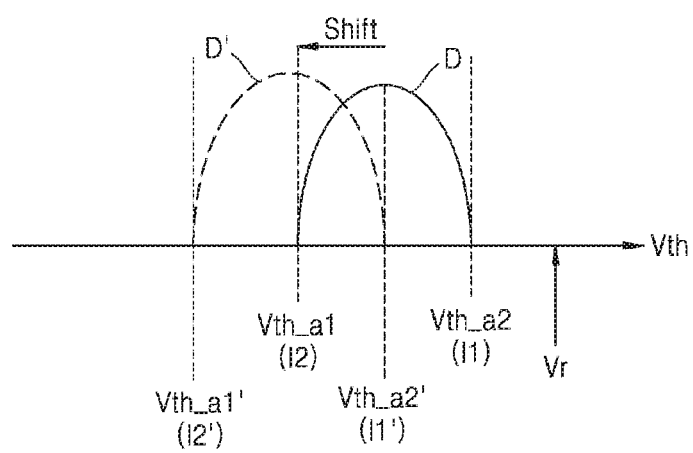

FIG. 8A is a block diagram of a memory device 600 according to an exemplary embodiment of the inventive concept, and FIGS. 8B and 8C are diagrams for describing a characteristic of a threshold voltage distribution of a memory cell according to an exemplary embodiment of the inventive concept. FIGS. 8D and 8E are diagrams for describing an operation of the memory device 600 of FIG. 8A according to an exemplary embodiment of the inventive concept.

Referring to FIG. 8A, the memory device 600 may include a page buffer 620 and a control logic 630. The control logic 630 may further include a control signal magnitude adjusting unit 632 and a develop section adjusting unit 634, and may control an operation of the page buffer 620 to write data to a memory cell array or read data from the memory cell array, based on a received command CMD, address ADDR, and control signal CTRL. The control logic 630 may provide a first pre-charge control signal PCCS1, a second pre-charge control signal PCCS2, a bit line connection control signal BLCCS, and a sensing node voltage control signal SNVCS to the page buffer 620 to control a sense operation for a sensing node corresponding to a memory cell selected as an object to which a read operation is to be performed.

The control signal magnitude adjusting unit 632 may adjust a magnitude of the sensing node voltage control signal SNVCS and the develop section adjusting unit 634 may adjust a develop section Period_2' based on the magnitude of the sensing node voltage control signal SNVCS. For example, the develop section adjusting unit 634 may adjust the develop section Period_2' such that the develop section Period_2' decreases as the magnitude of the sensing node voltage control signal SNVCS increases.

Referring to FIGS. 8A and 8B, the control signal magnitude adjusting unit 632 may adjust the sensing node voltage control signal SNVCS to a level of a voltage V2' that is higher than the level of the voltage V2 of FIG. 5A. In other words, the control logic 630 may provide the sensing node voltage control signal SNVCS having the level of the voltage VT to the page buffer 620. As described in reference to FIG. 4 and shown in FIG. 8B, when a magnitude of a voltage V2'-$V_{BL}$ that is obtained by subtracting the voltage $V_{BL}$ of the bit line from the voltage V2' of the sensing node voltage control signal SNVCS received by the sensing node connection transistor NM2 is equal to or higher than the threshold voltage Vth2 of the sensing node connection transistor NM2, the sensing node connection transistor NM2 may form the discharge path DP and discharge the sensing node SN. In other words, the sensing node connection transistor NM2 may discharge the sensing node SN after a discharge start time DST' has passed from a start point of the develop section Period_2'.

The magnitude of the sensing node voltage control signal SNVCS of FIG. 8B is greater than the magnitude of the sensing node voltage control signal SNVCS of FIG. 5A, and thus, the discharge start time DST' of FIG. 8B may be shorter than the discharge start time DST of FIG. 5A. As described above, as the discharge start time DST' of the sensing node SN decreases, the develop section adjusting unit 634 may adjust the develop section Period_2' to be shorter than the develop section Period_2 of FIG. 5A. The page buffer 620 of FIG. 8B may more rapidly sense the sensing node SN than the page buffer 400a described in reference to FIG. 5A.

Referring to FIGS. 8A and 8C, the control signal magnitude adjusting unit 632 may adjust the sensing node voltage control signal SNVCS to a level of a voltage V2" that is lower than the level of the voltage V2 of FIG. 5A. In other words, the control logic 630 may provide the sensing node voltage control signal SNVCS having the level of the voltage V2" to the page buffer 620. As described in reference to FIG. 4 and shown in FIG. 8B, when a magnitude of a voltage V2"-$V_{BL}$ that is obtained by subtracting the voltage $V_{BL}$ of the bit line from the voltage V2" of the sensing node voltage control signal SNVCS received by the sensing node connection transistor NM2 is equal to or higher than the threshold voltage Vth2 of the sensing node connection transistor NM2, the sensing node connection transistor NM2 may form the discharge path DP and discharge the sensing node SN. In other words, the sensing node connection transistor NM2 may discharge the sensing node SN after a discharge start time DST" has passed from a start point of a develop section Period_2".

The magnitude of the sensing node voltage control signal SNVCS of FIG. 8C is less than the magnitude of the sensing node voltage control signal SNVCS of FIG. 5A, and thus, the discharge start time DST" of FIG. 8B may be longer than the discharge start time DST of FIG. 5A. As described above, as the discharge start time DST" of the sensing node SN increases, the develop section adjusting unit 634 may adjust the develop section Period_2" to be longer than the develop section Period_2 of FIG. 5A. When sensing the sensing node SN, the page buffer 620 of FIG. 8B uses the sensing node voltage control signal SNVCS having less magnitude than the sensing node voltage control signal SNVCS of FIG. 5A. Thus, the page buffer 620 of FIG. 8B may save the power consumption, compared to the page buffer 400a FIG. 5A.

Referring to FIG. 8A again, according to an exemplary embodiment of the present inventive concept, the control signal magnitude adjusting unit 632 may receive adjustment information A_Info from the outside and adjust the magnitude of the sensing node voltage control signal SNVCS based on the received adjustment information A_Info. According to an exemplary embodiment of the inventive concept, the adjustment information A_Info received by the control signal magnitude adjusting unit 632 may include at least one of time information that is counted after the memory cell which is an object to which a read operation is to be performed, is programmed, and temperature information of the memory device 600. The develop section adjusting unit 634 may adjust the develop section based on any one of the adjustment information A_Info and the magnitude of the sensing node voltage control signal SNVCS.

Referring to FIGS. 3 and 8D, for example, when a first temperature Temp_1 is higher than a second temperature Temp_2, and when a read voltage is applied to the first word line WL1 that is selected at the first temperature Temp_1 and a pass voltage is applied to non-selected word lines WL2 through WLn, a magnitude of a current Icell flowing from the first bit line BL1 to the common source line CSL may be greater than a magnitude of a current Icell flowing from the first bit line BL1 to the common source line CSL when a read voltage is applied to the first word line WL1 that is selected at the second temperature Temp_2 and a pass voltage is applied to non-selected word lines WL2 through WLn.

In other words, since an average amount of charges that are pre-charged in the first bit line BL1 and are discharged to the common source line CSL at the second temperature Temp_2 is less than an average amount of charges that are pre-charged in the first bit line BL1 and are discharged to the common source line CSL at the first temperature Temp_1, a voltage drop slope of the first bit line BL1 at the second temperature Temp_2 may be less than a voltage drop slope of the first bit line BL1 at the first temperature Temp_1.

The control signal magnitude adjusting unit 632 may increase the magnitude of the sensing node voltage control signal SNVCS as shown in FIG. 8B, when a temperature of the memory device 600 is equal to or lower than a reference temperature, based on the adjustment information A_Info. For example, when the temperature of the memory device 600 is the second temperature Temp_2, the magnitude of the sensing node voltage control signal SNVCS is increased. Accordingly, the reliability of the operation of sensing the level of the voltage of the sensing node SN may be increased.

Referring to FIG. 8E, a threshold voltage distribution D right after certain data is programmed to the memory cells may be formed to have a range between a threshold voltage Vth_a1 and a threshold voltage Vth_a2. Thereafter, after a reference time has passed, charges stored in the memory cells are discharged, and thus, the threshold voltage distribution D may be shifted to decrease the threshold voltage so that a shifted threshold voltage distribution D' may be formed to have a range between a threshold voltage Vth_a1' and a threshold voltage Vth_a2'. Referring to FIG. 3, when a read voltage Vr is applied to the selected first word line WL1 and a pass voltage is applied to the non-selected word lines WL2 through WLn, according to the threshold voltage distribution D right after the program operation, a magnitude of a current flowing from the first bit line BL1 to the common source line CSL in the develop section may have a range of I1 and I2. In addition, according to the threshold voltage distribution D' after the reference time has passed, the magnitude of the current flowing from the first bit line BL1 to the common source line CSL in the develop section may have a range of I1' through I2'.

In other words, since an average amount of charges that are pre-charged in the first bit line BL1 and are discharged to the common source line CSL at the threshold voltage distribution D right after the program operation is less than an average amount of charges that are pre-charged in the first bit line BL1 and are discharged to the common source line CSL at the shifted threshold voltage distribution D' after the reference time has passed, a voltage drop slope of the first bit line BL1 at the shifted threshold voltage distribution D' may be greater than a voltage drop slope of the first bit line BL1 at the threshold voltage distribution D.

The control signal magnitude adjusting unit 632 may decrease the magnitude of the sensing node voltage control signal SNVCS as shown in FIG. 8C, when a time that is counted after the memory cell selected as an object to which the read operation is to be performed is programmed, is equal to or greater than the reference time, based on the adjustment information A_Info. Accordingly, power consumption of the page buffer 620 during the operation of sensing the level of the voltage of the sensing node SN may be reduced.

Figure 9:
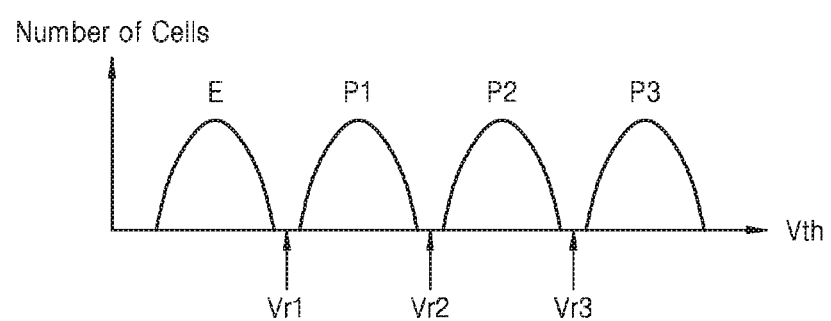
FIG. 9 is a diagram showing a threshold voltage distribution of memory cells of FIG. 3, when the memory cells are multi-level cells.

FIG. 9 is a diagram showing threshold voltage distribution of the memory cells of FIG. 3, when the memory cells are multi-level cells.

Referring to FIG. 9, a horizontal axis indicates a threshold voltage Vth and a longitudinal axis indicates the number of memory cells. When the memory cells MC are two-bit multi-level cells, the memory cells MC may have an erased state E, a first program state P1, a second program state P2, or a third program state P3. Generally, in order to read two-bit multi-level cells, a number of read operations using first through third read voltages Vr1 through Vr3 may be performed. Hereinafter, according to an exemplary embodiment the present inventive concept, a method of reading data of the memory cells MC via a memory device, will be described, wherein the memory cells MC are multi-level cells.

Figure 10:
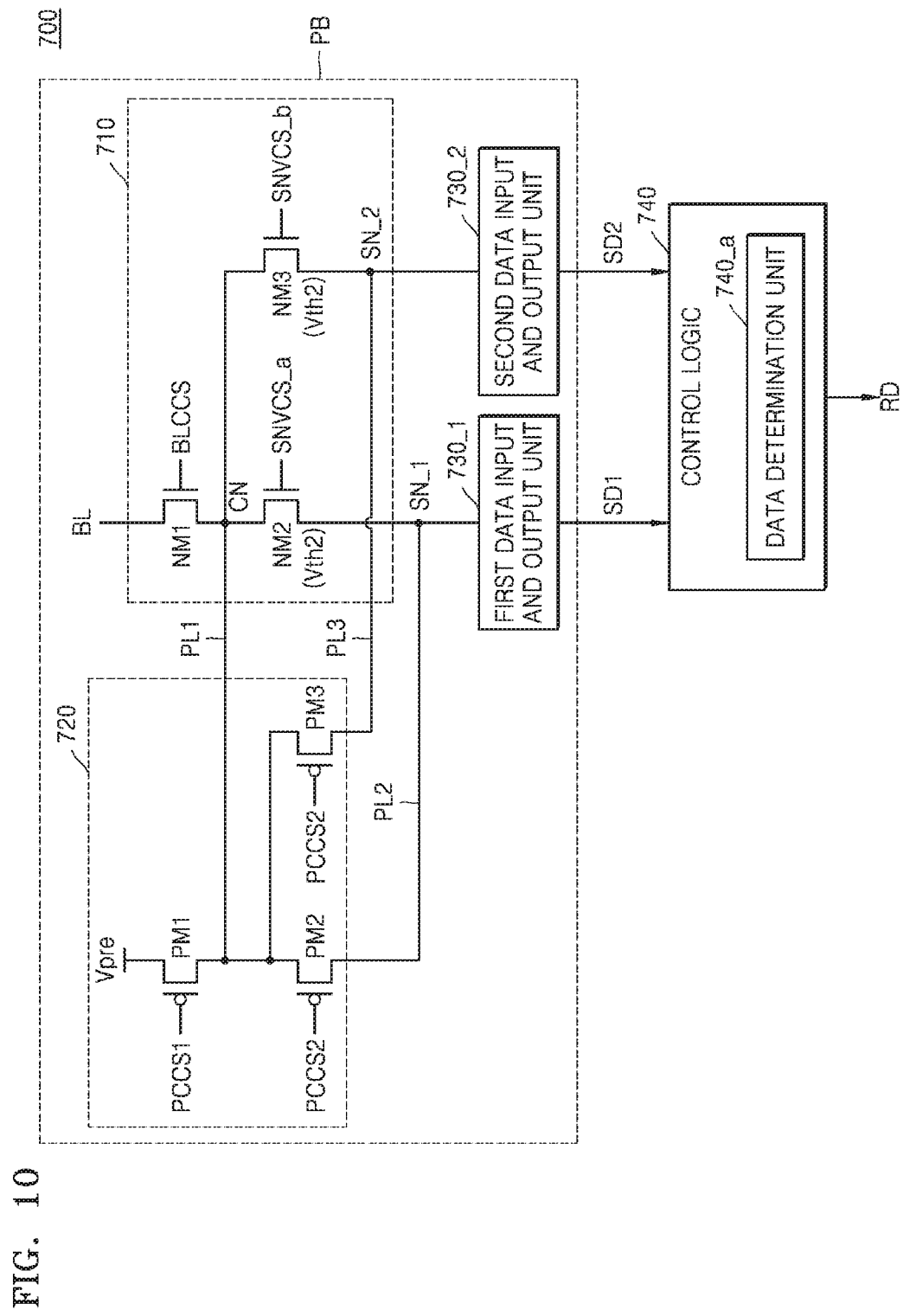
FIG. 10 is a diagram of the memory device of FIG. 3, according to an exemplary embodiment of the inventive concept.

FIG. 10 is a diagram of the memory device 200 of FIG. 3, according to an exemplary embodiment of the inventive concept.

Referring to FIG. 10, a memory device 700 may include a page buffer PB and a control logic 740. The page buffer PB may include a bit line connection unit 710, a pre-charge unit 720, and data input and output units 730_1 and 730_2. The bit line connection unit 710 according to an exemplary embodiment of the inventive concept may include a bit line connection transistor NM1 connected between a bit line BL and a connecting node CN, a first sensing node connection transistor NM2 connected between the connecting node CN and a first sensing node SN_1, and a second sensing node connection transistor NM3 connected between the connecting node CN and a second sensing node SN_2. A gate terminal of the first sensing node connection transistor NM2 may receive a first sensing node voltage control signal SNVCS_a, and a gate terminal of the second sensing node connection transistor NM3 may receive a second sensing node voltage control signal SNVCS_b. According to an exemplary embodiment of the inventive concept, a magnitude of the first sensing node voltage control signal SNVCS_a may be different from a magnitude of the second sensing node voltage control signal SNVCS_b. Hereinafter, it is assumed that the magnitude of the first sensing node voltage control signal SNVCS_a is greater than the magnitude of the second sensing node voltage control signal SNVCS_b. According to an exemplary embodiment of the inventive concept, the first sensing node connection transistor NM2 and the second sensing node connection transistor NM3 may have a threshold voltage Vth2. However, this is merely exemplary, and the present inventive concept is not limited thereto. A threshold voltage of the first sensing node connection transistor NM2 and a threshold voltage of the second sensing node connection transistor NM3 may be different from each other.

The pre-charge unit 720 may include first through third pre-charge transistors PM1 through PM3. A gate terminal of the first pre-charge transistor PM1 may receive a first pre-charge control signal PCCS1 and the second and third pre-charge transistors PM2 and PM3 may receive a second pre-charge control signal PCCS2 at their gates. However, this is merely exemplary, and the present inventive concept is not limited thereto. The second pre-charge transistor PM2 and the third pre-charge transistor PM3 may receive different pre-charge control signals.

According to an exemplary embodiment of the inventive concept, a second terminal of the first pre-charge transistor PM1 may be connected to the connecting node via a first pre-charge line PL1, and the first pre-charge transistor PM1 may pre-charge the bit line BL to a voltage that is obtained by subtracting a threshold voltage of the bit line connection transistor NM1 from a bit line connection control signal BLCCS, in response to the first pre-charge control signal PCCS1. A second terminal of the second pre-charge transistor PM2 may be connected to the first sensing node SN_1 via a second pre-charge line PL2, and the second pre-charge transistor PM2 may pre-charge the first sensing node SN_1 to a pre-charge voltage Vpre, in response to the second pre-charge control signal PCCS2. A second terminal of the third pre-charge transistor PM3 may be connected to the second sensing node SN_2 via a third pre-charge line PL3, and the third pre-charge transistor PM3 may pre-charge the second sensing node SN_2 to the pre-charge voltage Vpre, in response to the second pre-charge control signal PCCS2.

As described above, after the bit line BL and the first and second sensing nodes SN_1 and SN_2 are pre-charged, the first and second sensing node connection transistors NM2 and NM3 may control voltages of the first and second sensing nodes SN_1 and SN_2 in a develop section, based on the threshold voltage of the first and second sensing node connection transistors NM2 and NM3, a voltage of the bit line BL, and the first and second sensing node voltage control signals SNVCS_a and SNVCS_b.

In a sensing section, the data input and output units 730_1 and 730_2 may sense a level of a voltage of the first sensing node SN_1 and a level of a voltage of the second sensing node SN_2, respectively, may generate first sensing data SD1 and second sensing data SD2, and provide the first and second sensing data SD1 and SD2 to the control logic 740. The control logic 740 may further include a data determination unit 740_a, and the data determination unit 740_a may determine read data of a memory cell selected as an object to which a read operation is to be performed, based on the first and second sensing data SD1 and SD2 received from the data input and output units 730_1 and 730_2. However, this configuration is merely exemplary, and the present inventive concept is not limited thereto. According to an exemplary embodiment of the inventive concept, the data determination unit 740_a may be included in the page buffer PB. Detailed aspects thereof will be described by referring to FIGS. 11A through 11D.

Figure 11A:
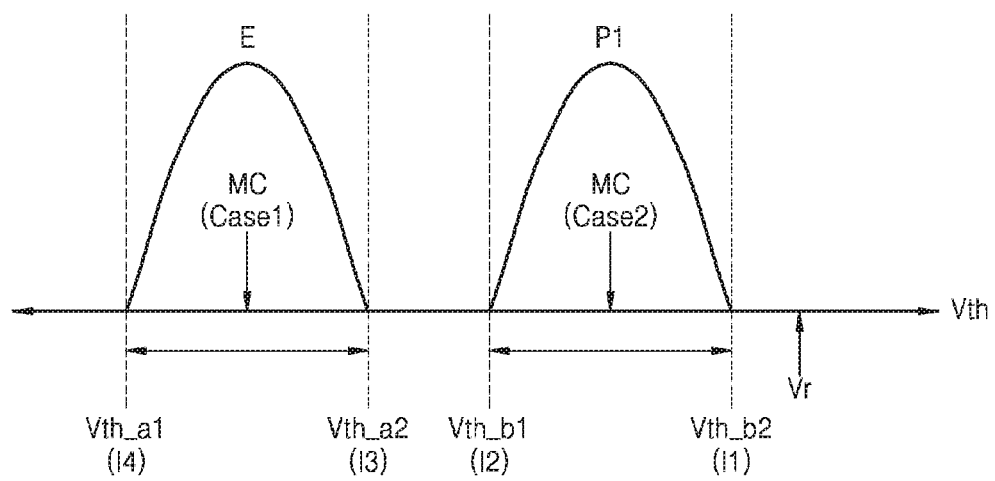
FIG. 11A is a diagram showing a threshold voltage distribution of memory cells for describing an operation of a page buffer of FIGS. 8A through 8E according to an exemplary embodiment of the inventive concept.
Figure 11B:
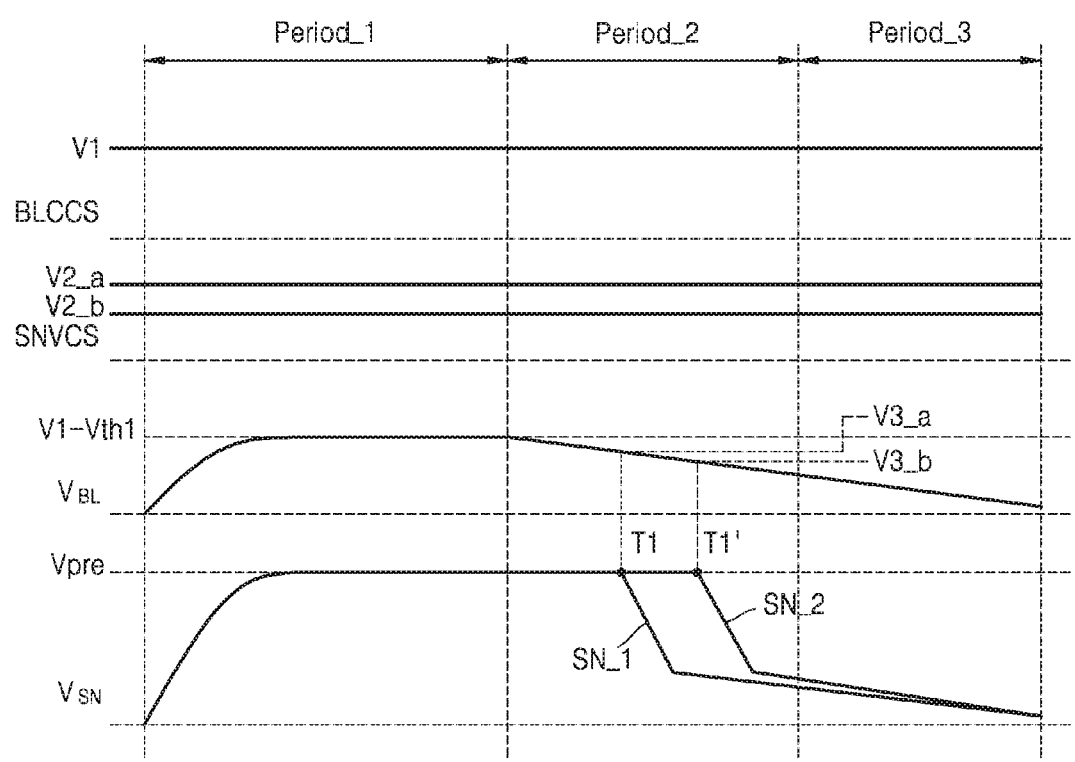
FIG. 11B is a diagram for describing an operation of a page buffer when a memory cell is in an erased state according to an exemplary embodiment of the inventive concept.
Figure 11C:
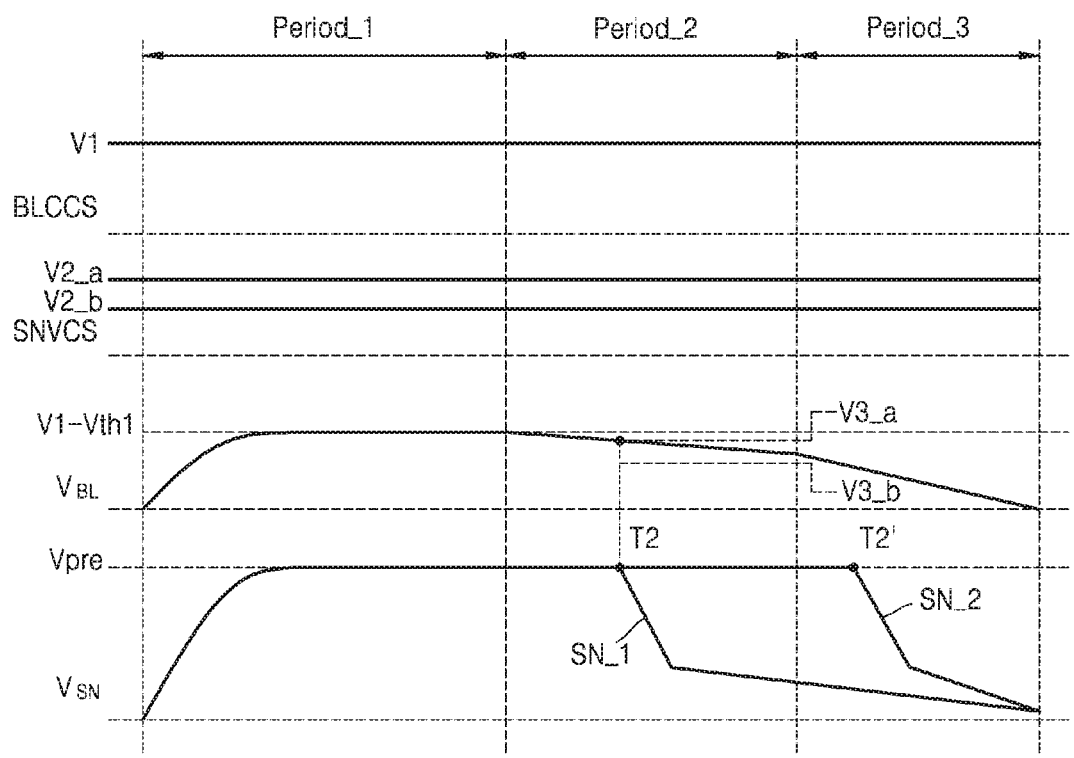
FIG. 11C is a diagram for describing an operation of a page buffer when a memory cell is in a first program state according to an exemplary embodiment of the inventive concept.

FIG. 11A is a diagram showing threshold voltage distribution of memory cells MC for describing an operation of the page buffer 620 of FIGS. 8A through 8E according to an exemplary embodiment of the inventive concept. FIG. 11B is a diagram for describing an operation of the page buffer 620 when the memory cells MC are in an erased state according to an exemplary embodiment of the inventive concept. FIG. 11C is a diagram for describing an operation of the page buffer 620 when the memory cells MC are in a first program state according to an exemplary embodiment of the inventive concept. FIG. 11D is a diagram for describing a method of determining read data of the memory cells MC according to an exemplary embodiment of the inventive concept.

Referring to FIG. 11A, when the memory cells MC are in the erased state E (case 1), the threshold voltage distribution may have a range between a threshold voltage Vth_a1 and a threshold voltage Vth_a2. When the memory cells MC are in the first program state P1 (case 2), the threshold voltage distribution may have a range between a threshold voltage Vth_b1 and a threshold voltage Vth_b2. Referring to FIG. 3, when a read voltage Vr is applied to the selected first word line WL1 and a pass voltage is applied to the non-selected word lines WL2 through WLn, when the memory cells MC are in the erased state E, a magnitude of a current Icell flowing from the first bit line BL1 to the common source line CSL in the develop section may have a range of I3 through I4. In addition, when the memory cells MC are in the first program state P1, the magnitude of the current Icell flowing from the first bit line BL1 to the common source line CSL in the develop section may have a range of I1 through I2. As described above, a slope of a voltage drop of the first bit line BL1 may vary in the develop section, according to the program state of the memory cells MC, and the memory device 600 according to an exemplary embodiment of the present inventive concept may read the data of the memory cells MC based on this characteristic.

Referring to FIGS. 10, 11A, and 11B, before the pre-charge section Period_1, the bit line connection transistor NM1 corresponding to the bit line BL of the memory cell that is the object to which the read operation is to be performed, may receive the bit line connection control signal BLCCS having a level of a voltage V1, the first sensing node connection transistor NM2 may receive a first sensing node voltage control signal SNVCS_a having a level of a voltage V2_a, and the second sensing node connection transistor NM3 may receive a second sensing node voltage control signal SNVCS_b having a level of a voltage V2_b.

The operation in the pre-charge section Period_1 is described in detail with reference to FIG. 5A, and thus, it may not be further described. In the develop section Period_2, when the selected memory cell is in an erased state E, the first sensing node connection transistor NM2 may form a discharge path and discharge the first sensing node SN_1, from a timing T1 at which a voltage $V2\_a\text{-}V_{BL}$ that is obtained by subtracting a voltage $V_{BL}$ of the bit line from the voltage V2_a of the first sensing node voltage control signal SNVCS_a received by the first sensing node connection transistor NM2, is equal to or higher than the threshold voltage Vth2 of the first sensing node connection transistor NM2. For example, when the voltage $V_{BL}$ of the bit line drops to a level that is equal to or less than a voltage V3_a, the first sensing node SN_1 may be discharged, and a voltage $V_{SN\_1}$ of the first sensing node SN_1 may drop.

In addition, in the develop section Period_2, the second sensing node connection transistor NM3 may form a discharge path and discharge the second sensing node SN_2, from a timing T1' at which a voltage $V2\_b\text{-}V_{BL}$ that is obtained by subtracting the voltage $V_{BL}$ of the bit line from the voltage V2_b of the second sensing node voltage control signal SNVCS_b received by the second sensing node connection transistor NM3, is equal to or higher than the threshold voltage Vth2 of the second sensing node connection transistor NM3. For example, when the voltage $V_{BL}$ of the bit line drops to a level that is equal to or less than a voltage V3_b, the second sensing node SN_2 may be discharged, and a voltage $V_{SN\_2}$ of the second sensing node SN_2 may drop.

In the sensing section Period_3, the first data input and output unit 730_1 may provide to the control logic 740 the first sensing data SD1 generated by sensing a level of the voltage $V_{SN\_1}$ of the first sensing node SN_1 in response to a latch set signal SET transiting from a low level to a high level. In addition, the second data input and output unit 730_2 may provide to the control logic 740 the second sensing data SD2 generated by sensing a level of the voltage $V_{SN\_2}$ of the second sensing node SN_2 in response to the latch set signal SET. For example, the first sensing data SD1 and the second sensing data SD2 may have values of "0."

Referring to FIGS. 10, 11A, and 11C, in the develop section Period_2, when the selected memory cell is in the first program state P1, a slope of a drop of the voltage $V_{BL}$ of the bit line may be less than a slope of a drop of the voltage $V_{BL}$ of the bit line in FIG. 11B. A timing T2 at which the voltage V2_a-$V_{BL}$ that is obtained by subtracting the voltage $V_{BL}$ of the bit line from the voltage V2_a of the first sensing node voltage control signal SNVCS_a received by the first sensing node connection transistor NM2, is equal to or higher than the threshold voltage Vth2 of the first sensing node connection transistor NM2, may be slower than the timing T1 in FIG. 11B.

In addition, a timing T2' at which the voltage V2_b-$V_{BL}$ obtained by subtracting the voltage $V_{BL}$ of the bit line from the voltage V2_b of the second sensing node voltage control signal SNVCS_b received by the second sensing node connection transistor NM3, is equal to or higher than the threshold voltage Vth2 of the second sensing node connection transistor NM3, may deviate from the develop section Period_2, or may not occur. Thus, the second data input and output unit 730_2 may sense a level of the voltage $V_{SN\_2}$ of the second sensing node SN_2 as a level of the pre-charge voltage Vpre.

In the sensing section Period_3, the first data input and output unit 730_1 may provide to the control logic 740 the first sensing data SD1 generated by sensing the level of the voltage $V_{SN\_1}$ of the first sensing node SN_1 in response to the latch set signal SET transiting from a low level to a high level. In addition, the second data input and output unit 730_2 may provide to the control logic 740 the second sensing data SD2 generated by sensing the level of the voltage $V_{SN\_2}$ of the second sensing node SN_2 in response to the latch set signal SET. For example, the first sensing data SD1 may have a value of "0," and the second sensing data SD2 may have value of "1."

Referring to FIGS. 10, 11A, and 11D, as illustrated in a table Table_1, when the memory cells MC are in the erased state E (case 1), the data determination unit 740_a may receive sensing data of "00." In addition, when the memory cells MC are in the first program state P1 (case 2), the data determination unit 740_a may receive sensing data of "01." The data determination unit 740_a may generate read data RD indicating that the memory cells MC are in the erased state E, based on the sensing data of "00," and output the read data RD to the outside. In addition, the data determination unit 740_a may generate read data RD indicating that the memory cells MC are in the first program state P1, based on the sensing data of "01," and output the read data RD to the outside.

As described above, the memory device 700 according to the present embodiment may sense multi-bits by performing the read operation with respect to the memory cell once.

Figure 12A:
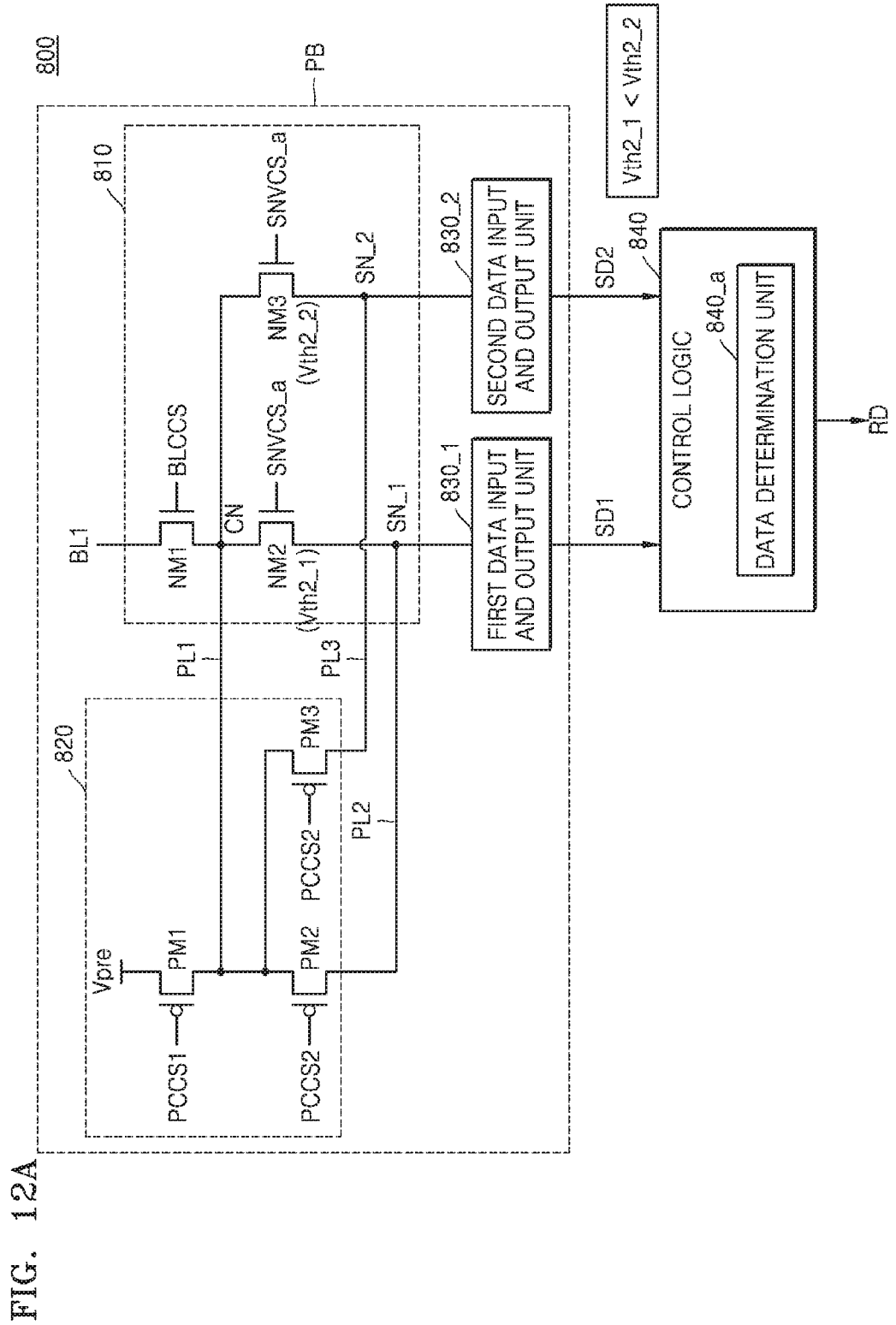
FIG. 12A is a diagram of the memory device of FIG. 10, according to an exemplary embodiment of the inventive concept.
Figure 12B:
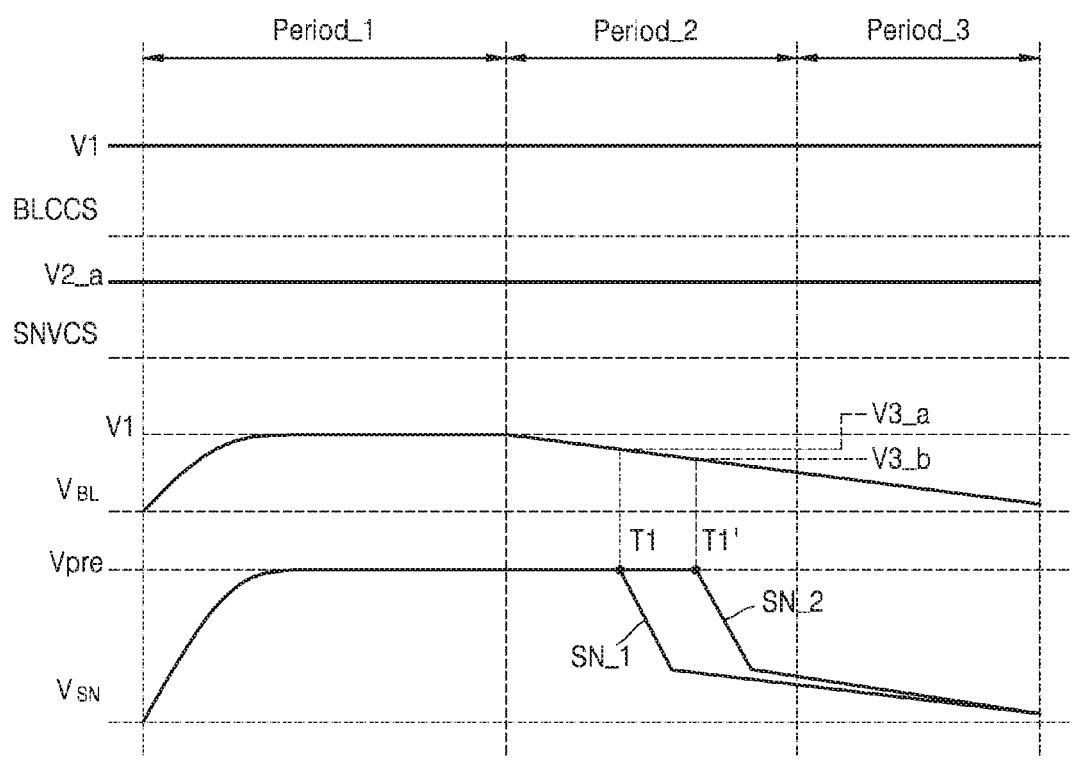
FIG. 12B is a diagram for describing an operation of the memory device of FIG. 12A according to an exemplary embodiment of the inventive concept.

FIG. 12A is a diagram of the memory device 700 of FIG. 10, according to an exemplary embodiment of the inventive concept, and FIG. 12B is a diagram for describing an operation of the memory device 700 of FIG. 12A according to an exemplary embodiment of the inventive concept.

Referring to FIG. 12A, there is provided a memory device 800 that includes a page buffer PB and a control logic 840. The page buffer PB may include a bit line connection unit 810, a pre-charge unit 820, and data input and output units 830_1 and 830_2. The control logic 840 includes a data determination unit 840_a. These devices are the same as those shown in FIG. 10 expect for the bit line connection unit 810. For example, compared to FIG. 10, a gate terminal of the first sensing node connection transistor NM2 and a gate terminal of the second sensing node connection transistor NM3 may receive a first sensing node voltage control signal SNVCS_a. For example, the same level voltage may be applied to the gates of the first and second sensing node connection transistor NM2 and NM3. The first sensing node connection transistor NM2 may have a threshold voltage Vth2_1, and the second sensing node connection transistor NM3 may have a threshold voltage Vth2_2. The threshold voltage Vth2_2 of the second sensing node connection transistor NM3 may be greater than the threshold voltage Vth2_1 of the first sensing node connection transistor NM2.

Referring to FIG. 12B, in the develop section Period_2, when the selected memory cell is in an erased state E, the first sensing node connection transistor NM2 may form a discharge path and discharge the first sensing node SN_1, from a timing T1 at which a voltage V2_a-$V_{BL}$ that is obtained by subtracting a voltage $V_{BL}$ of the bit line from a voltage V2_a of the first sensing node voltage control signal SNVCS_a received by the first sensing node connection transistor NM2, is equal to or higher than the threshold voltage Vth2_1 of the first sensing node connection transistor NM2.

In addition, in the develop section Period_2, the second sensing node connection transistor NM3 may form a discharge path and discharge the second sensing node SN_2, from a timing T1' at which a voltage V2_b-$V_{BL}$ that is obtained by subtracting the voltage $V_{BL}$ of the bit line from a voltage V2_b of the first sensing node voltage control signal SNVCS_a received by the second sensing node connection transistor NM3, is equal to or higher than the threshold voltage Vth2_2 of the second sensing node connection transistor NM3.

As described above, in the memory device 700 of the present embodiment, the threshold voltage Vth2_1 of the first sensing node connection transistor NM2 and the threshold voltage Vth2_2 of the second sensing node connection transistor NM3 may be different, and the sensing node voltage control signal SNVCS_a having the same voltage level may be used to perform the sensing operation with respect to the first and second sensing nodes SN_1 and SN_2.

Figure 13:
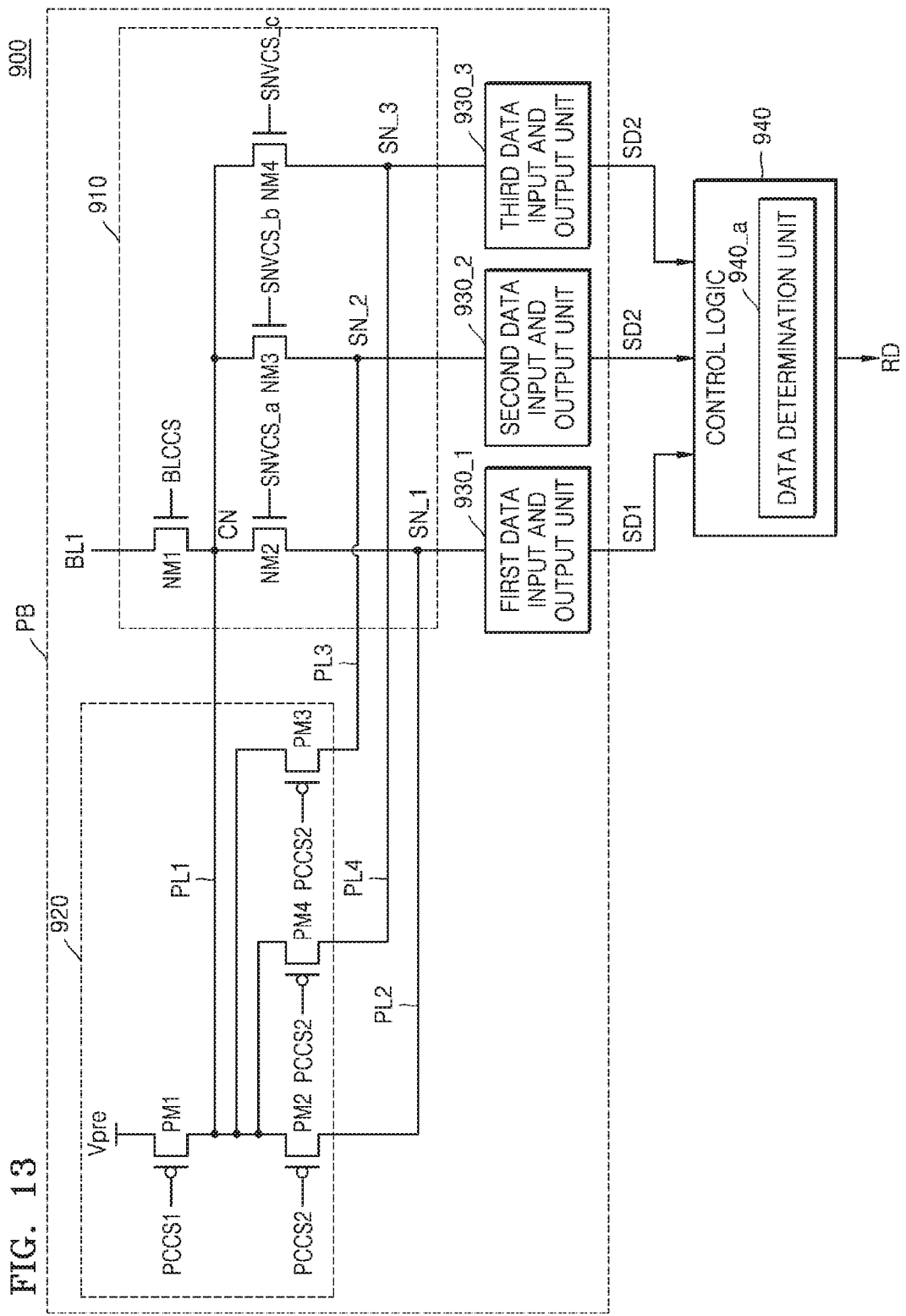
FIG. 13 is a diagram of a memory device for reading data of a two-bit multi-level cell, according to an exemplary embodiment of the inventive concept.

FIG. 13 is a diagram of a memory device 900 for reading data of a two-bit multi-level cell, according to an exemplary embodiment of the inventive concept.

Referring to FIG. 13, the memory device 900 may include a page buffer PB and a control logic 940. The page buffer PB may include a bit line connection unit 910, a pre-charge unit 920, and first, second, and third data input and output units 930_1, 930_2, and 930_3. Compared to the bit line connection unit 710 of FIG. 10, the bit line connection unit 910 may further include a third sensing node connection transistor NM4 connected between the connecting node CN and a third sensing node SN_3. In addition, compared to the pre-charge unit 720 of FIG. 10, the pre-charge unit 920 may further include a fourth pre-charge transistor PM4, and the fourth pre-charge transistor PM4 may pre-charge the third sensing node SN_3 to a pre-charge voltage Vpre via a fourth pre-charge line PL4, in response to a second pre-charge control signal PCCS2.

After a bit line BL and the first through third sensing nodes SN_1 through SN_3 are pre-charged, the first through third sensing node connection transistors NM2, NM3, and NM4 may control voltages of the first through third sensing nodes SN_1 through SN_3, based on threshold voltages of the first through third sensing node connection transistors NM2, NM3, and NM4, a voltage $V_{BL}$ of the bit line BL, and sensing node voltage control signals SNVCS_a, SNVCS_b, and SNVCS_c, in the develop section.

In the sensing section, the data input and output units 930_1 through 930_3 may generate first sensing data SD1, second sensing data SD2, and third sensing data SD3 by sensing voltage levels of the first through third sensing nodes SN_1, SN_2, and SN_3, respectively, and provide the first through third sensing data SD1 through SD3 to the control logic 940. A data determination unit 940_a of the control logic 940 may determine read data of a memory cell that is selected as an object to which a read operation is to be performed, based on the first through third sensing data SD1 through SD3 received from the data input and output units 930_1 through 930_3. Via this configuration, the memory device 900 may read the data of the two-bit multi-level cell by performing a read operation once. Detailed aspects of this will be described with reference to FIGS. 14A through 14E.

Figure 14A:
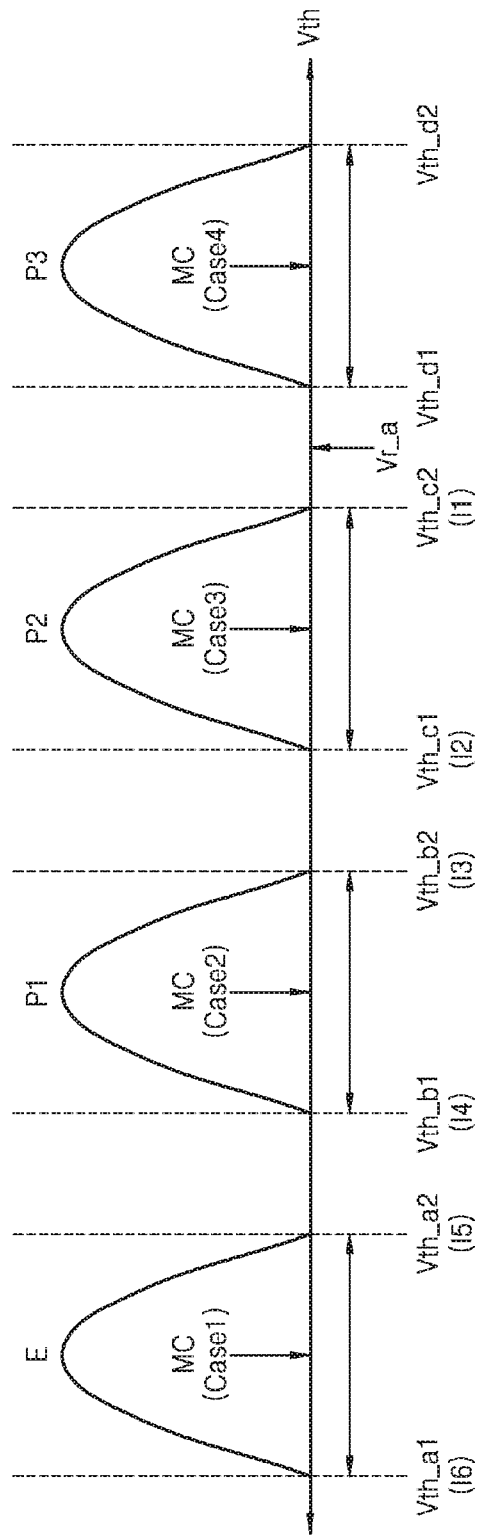
FIG. 14A is a diagram showing a threshold voltage distribution of memory cells for describing an operation of a page buffer of FIG. 13 according to an exemplary embodiment of the inventive concept.
Figure 14B:
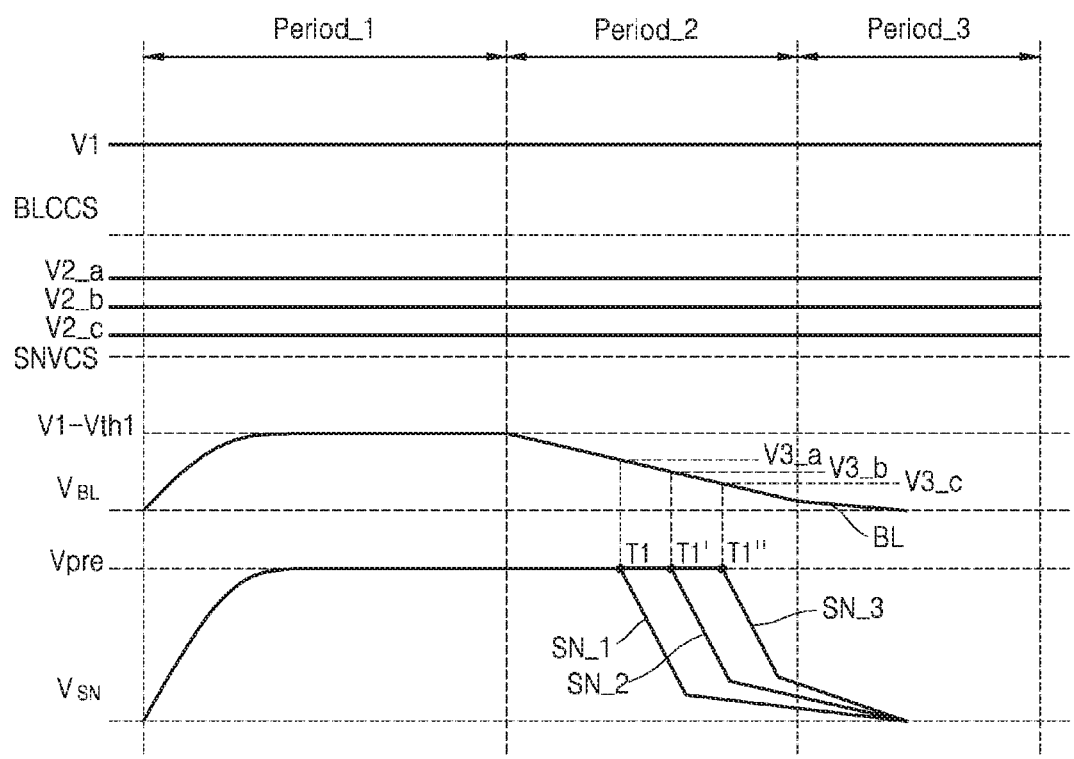
FIGS. 14B through 14E are diagrams for describing an operation of a page buffer, according to a program state of each of memory cells according to an exemplary embodiment of the inventive concept.
Figure 14C:
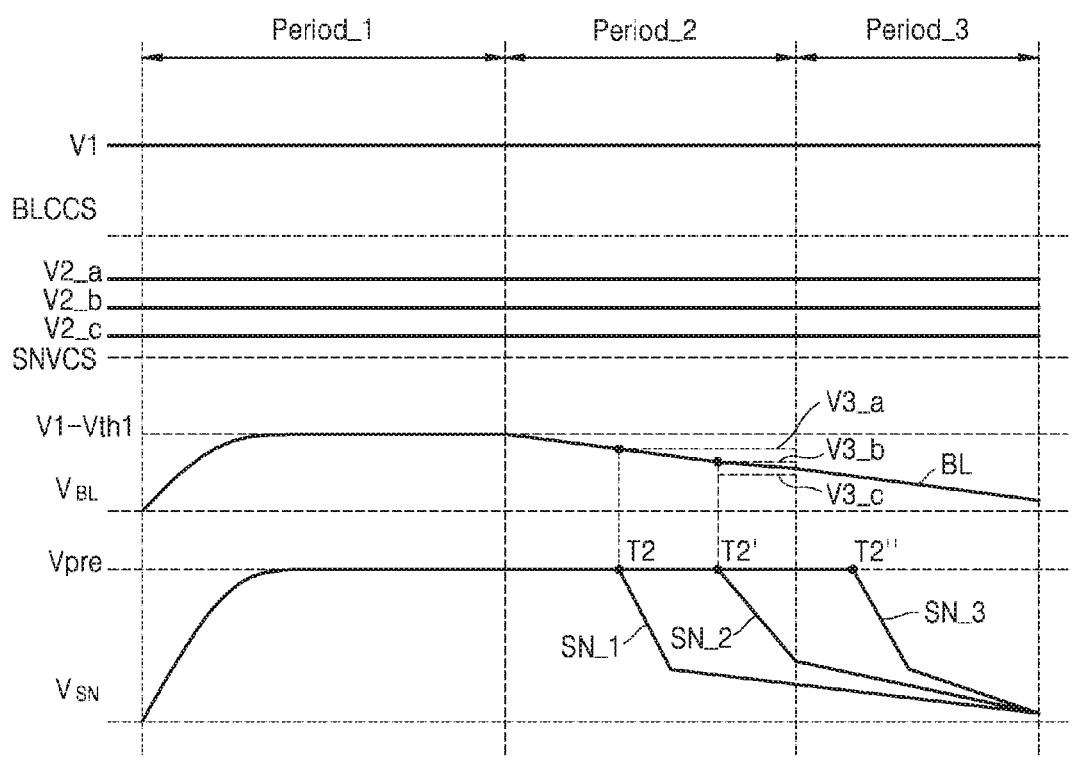
Figure 14D:
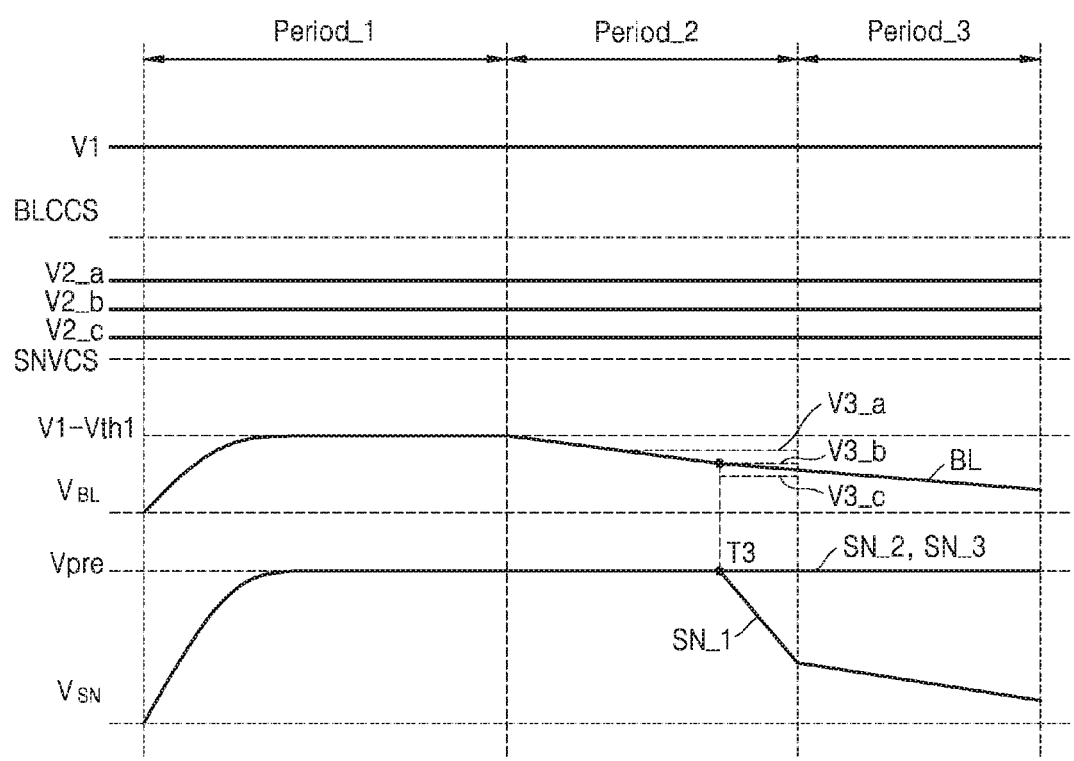
Figure 14E:
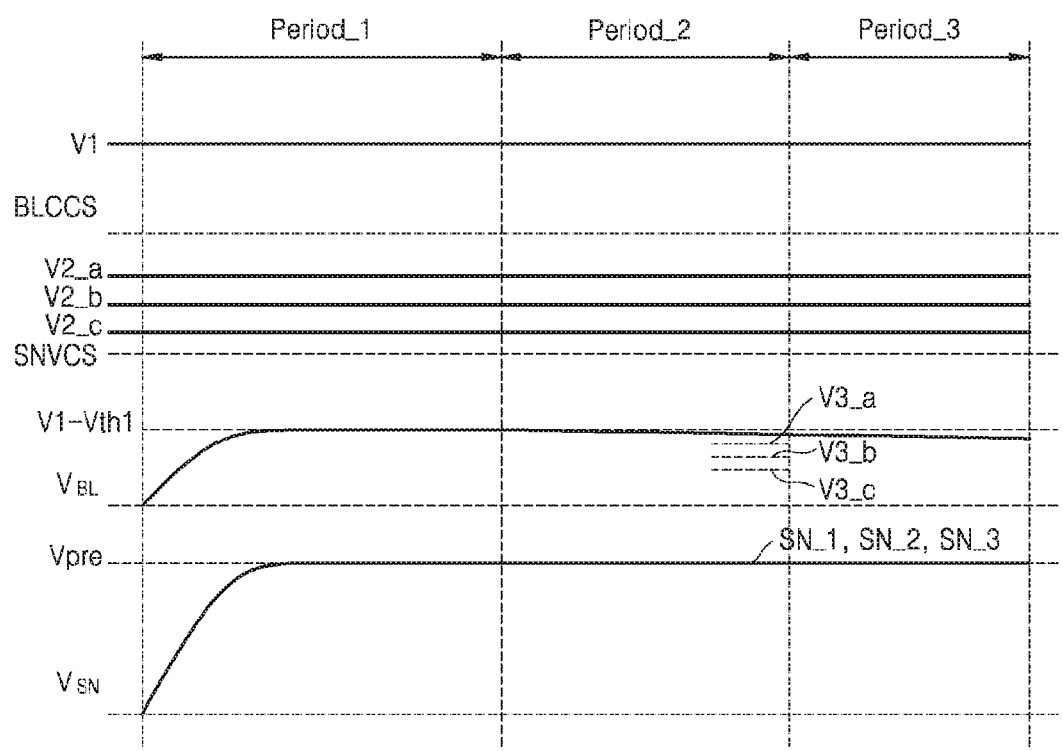

FIG. 14A is a diagram showing threshold voltage distribution of memory cells MC for describing an operation of the page buffer PB of FIG. 13 according to an exemplary embodiment of the inventive concept. FIG. 14B is a diagram for describing an operation of the buffer page PB when the memory cells MC are in an erased state according to an exemplary embodiment of the inventive concept. FIG. 14C is a diagram for describing an operation of the page buffer PB when the memory cells MC are in a first program state according to an exemplary embodiment of the inventive concept. FIG. 14D is a diagram for describing an operation of the page buffer PB when the memory cells MC are in a second program state according to an exemplary embodiment of the inventive concept. FIG. 14E is a diagram for describing an operation of the page buffer PB when the memory cells MC are in a third program state according to an exemplary embodiment of the inventive concept. FIG. 14F is a diagram for describing a method of determining read data of the memory cells MC according to an exemplary embodiment of the inventive concept.

Referring to FIG. 14A, when the memory cells MC are in an erased state E (case 1), the threshold voltage distribution may have a range between a threshold voltage Vth_a1 and a threshold voltage Vth_a2. When the memory cells MC are in a first program state P1 (case 2), the threshold voltage distribution may have a range between a threshold voltage Vth_b1 and a threshold voltage Vth_b2. When the memory cells MC are in a second program state P2 (case 3), the threshold voltage distribution may have a range between a threshold voltage Vth_c1 and a threshold voltage Vth_c2. When the memory cells MC are in a third program state P3 (case 4), the threshold voltage distribution may have a range between a threshold voltage Vth_d1 and a threshold voltage Vth_d2. Referring to FIG. 3, when a read voltage Vr1 is applied to the selected first word line WL1, and a pass voltage is applied to the non-selected word lines WL2 through WLn, when the memory cells MC are in the erased state E, a magnitude of a current Icell flowing from a first bit line BL1 to the common source line CSL in the develop section may have a range of I5 through I6. When the memory cells MC are in the first program state P1, the magnitude of the current Icell may have a range of I3 through I4. When the memory cells MC are in the second program state P2, the magnitude of the current Icell may have a range of I1 through I2. The read voltage Vr_a may be the same as the third read voltage Vr3 of FIG. 9. When the memory cells MC are in the third program state P3, the memory cells MC are off cells, and the current may not flow from the bit line BL1 to the common source line CSL. As shown above, according to the program state of the memory cells MC, a slope of a voltage drop of the first bit line BL1 may vary in the develop section, and the memory device 900 according to the present embodiment may read the data of the memory cells MC based on this characteristic.

Referring to FIGS. 13 and 14B, before the pre-charge section Period_1, the bit line connection transistor NM1 corresponding to the bit line BL of the memory cell that is an object to which a read operation is to be performed, may receive the bit line connection control signal BLCCS having the level of the voltage V1, the first sensing node connection transistor NM2 may receive the first sensing node voltage control signal SNVCS_a having the level of the voltage V2_a, the second sensing node connection transistor NM3 may receive the second sensing node voltage control signal SNVCS_b having the level of the voltage V2_b, and the third sensing node connection transistor NM4 may receive the third sensing node voltage control signal SNVCS_c having the level of the voltage V2_c.

In the develop section Period_2, when the selected memory cell is in the erased state E, the first sensing node connection transistor NM2 may form a discharge path and discharge the first sensing node SN_1, from a timing T1 at which a voltage $V2\_a - V_{BL}$ that is obtained by subtracting a voltage $V_{BL}$ of the bit line from the voltage V2_a of the first sensing node voltage control signal SNVCS_a received by the first sensing node connection transistor NM2, is equal to or higher than a threshold voltage Vth2 of the first sensing node connection transistor NM2. For example, when the voltage $V_{BL}$ of the bit line drops to a level that is equal to or less than a voltage V3_a, the first sensing node SN_1 may be discharged, and a voltage $V_{SN\_1}$ of the first sensing node SN_1 may drop.

In the develop section Period_2, the second sensing node connection transistor NM3 may form a discharge path and discharge the second sensing node SN_2, from a timing T1' at which a voltage $V2\_b - V_{BL}$ that is obtained by subtracting the voltage $V_{BL}$ of the bit line from the voltage V2_b of the second sensing node voltage control signal SNVCS_b received by the second sensing node connection transistor NM3, is equal to or higher than the threshold voltage Vth2 of the second sensing node connection transistor NM3. For example, when the voltage $V_{BL}$ of the bit line drops to a level that is equal to or less than a voltage V3_b, the second sensing node SN_2 may be discharged, and a voltage $V_{SN\_2}$ of the second sensing node SN_2 may drop.

In the develop section Period_2, the third sensing node connection transistor NM4 may form a discharge path and discharge the third sensing node SN_3 from a timing T1" at which a voltage $V2\_c - V_{BL}$ that is obtained by subtracting the voltage $V_{BL}$ of the bit line from the voltage V2_c of the third sensing node voltage control signal SNVCS_c received by the third sensing node connection transistor NM4, is equal to or higher than a threshold voltage Vth3 of the third sensing node connection transistor NM4. For example, when the voltage $V_{BL}$ of the bit line drops to a level that is equal to or less than a voltage V3_c, the third sensing node SN_3 may be discharged, and a voltage $V_{SN\_3}$ of the third sensing node SN_3 may drop.

In the sensing section Period_3, the first data input and output unit 930_1 may provide to the control logic 940 first sensing data SD1 generated by sensing the voltage $V_{SN\_1}$ of the first sensing node SN_1 in response to a latch set signal SET transiting from a low level to a high level. In addition, the second data input and output unit 930_2 may provide to the control logic 940 second sensing data SD2 generated by sensing the voltage $V_{SN\_2}$ of the second sensing node SN_2 in response to the latch set signal SET. In addition, the third data input and output unit 930_3 may provide to the control logic 940 third sensing data SD3 generated by sensing the voltage $V_{SN\_3}$ of the third sensing node SN_3 in response to the latch set signal SET. For example, the first sensing data SD1 through the third sensing data SD3 may have values of "0."

Referring to FIGS. 13 and 14C, in the develop section Period_2, when the selected memory cell is in the first program state P1, a slope of a drop of the voltage $V_{BL}$ of the bit line BL may be less than the slope of the drop of the voltage $V_{BL}$ of the bit line BL in FIG. 14B. A timing T2 at which the voltage V2_a-$V_{BL}$ that is obtained by subtracting the voltage $V_{BL}$ of the bit line from the voltage V2_a of the first sensing node voltage control signal SNVCS_a received by the first sensing node connection transistor NM2, is equal to or higher than the threshold voltage Vth2 of the first sensing node connection transistor NM2, may be slower than the timing T1 of FIG. 14B.

A timing T2' at which the voltage V2_b-$V_{BL}$ obtained by subtracting the voltage $V_{BL}$ of the bit line from the voltage V2_b of the second sensing node voltage control signal SNVCS_b received by the second sensing node connection transistor NM3, is equal to or higher than the threshold voltage Vth2 of the second sensing node connection transistor NM3, may be slower than the timing T1' of FIG. 14B.

A timing T2" at which the voltage V2_c-$V_{BL}$ obtained by subtracting the voltage $V_{BL}$ of the bit line from the voltage V2_c of the third sensing node voltage control signal SNVCS_c received by the third sensing node connection transistor NM4, is equal to or higher than the threshold voltage Vth3 of the third sensing node connection transistor NM4, may deviate from the develop section Period_2, or may not occur.

In the sensing section Period_3, the first through third sensing data SD1, SD2, and SD3 generated by the first through third data input and output units 930_1 through 930_3 may have values of "0," "0," and "1," respectively.

Referring to FIGS. 13 and 14D, in the develop section Period_2, when the selected memory cell is in the second program state P2, a slope of a drop of the voltage $V_{BL}$ of the bit line BL may be less than the slope of the drop of the voltage $V_{BL}$ of the bit line BL in FIG. 14C. A timing T3 at which the voltage V2_a-$V_{BL}$ obtained by subtracting the voltage $V_{BL}$ of the bit line from the voltage V2_a of the first sensing node voltage control signal SNVCS_a received by the first sensing node connection transistor NM2, is equal to or higher than the threshold voltage of the first sensing node connection transistor NM2, may be slower than the timing T2 in FIG. 14C.

A timing at which the voltage V2_b-$V_{BL}$ obtained by subtracting the voltage $V_{BL}$ of the bit line from the voltage V2_b of the second sensing node voltage control signal SNVCS_b received by the second sensing node connection transistor NM3, is equal to or higher than the threshold voltage of the second sensing node connection transistor NM3, may not occur, or deviate from the develop section Period_2.

A timing at which the voltage V2_c-$V_{BL}$ obtained by subtracting the voltage $V_{BL}$ of the bit line from the voltage V2_c of the third sensing node voltage control signal SNVCS_c received by the third sensing node connection transistor NM4, is equal to or higher than the threshold voltage of the third sensing node connection transistor NM4, may not occur, or deviate from the develop section Period_2.

In the sensing section Period_3, the first through third sensing data SD1, SD2, and SD3 generated by the first through third data input and output units 930_1 through 930_3 may have values of "0," "1," and "1," respectively.

Referring to FIGS. 13 and 14E, in the develop section Period_2, when the selected memory cell is in the second program state P2, a slope of a drop of the voltage $V_{BL}$ of the bit line BL may be less than the slope of the drop of the voltage $V_{BL}$ of the bit line BL in FIG. 14C. A timing at which the voltage V2_a-$V_{BL}$ obtained by subtracting the voltage $V_{BL}$ of the bit line BL from the voltage V2_a of the first sensing node voltage control signal SNVCS_a received by the first sensing node connection transistor NM2, is equal to or higher than the threshold voltage of the first sensing node connection transistor NM2, may not occur, or deviate from the develop section Period_2.

A timing at which the voltage V2_b-$V_{BL}$ obtained by subtracting the voltage $V_{BL}$ of the bit line BL from the voltage V2_b of the second sensing node voltage control signal SNVCS_b received by the second sensing node connection transistor NM3, is equal to or higher than the threshold voltage of the second sensing node connection transistor NM3, may not occur, or deviate from the develop section Period_2.

A timing at which the voltage V2_c-$V_{BL}$ obtained by subtracting the voltage $V_{BL}$ of the bit line BL from the voltage V2_c of the third sensing node voltage control signal SNVCS_c received by the third sensing node connection transistor NM4, is equal to or higher than the threshold voltage of the third sensing node connection transistor NM4, may not occur, or deviate from the develop section Period_2.

In the sensing section Period_3, the first through third sensing data SD1, SD2, and SD3 generated by the first through third data input and output units 930_1 through 930_3 may have values of "1," "1," and "1," respectively.

Referring to FIGS. 13, 14A, and 14F, as illustrated in a table Table_2, when the memory cells MC are in the erased state E (case 1), the data determination unit 940_a may receive sensing data of "000." In addition, when the memory cells MC are in the first program state P1 (case 2), the data determination unit 940_a may receive sensing data of "001." When the memory cells MC are in the second program state P2 (case 3), the data termination unit 940_a may receive sensing data of "011." When the memory cells MC are in the third program state P3 (case 4), the data determination unit 940_a may receive sensing data of "111." The data determination unit 940_a may generate read data RD indicating that the memory cells MC are in the erased state E, based on the sensing data of "000," and output the read data RD to the outside. The data determination unit 940_a may generate read data RD indicating that the memory cells MC are in the first program state P1, based on the sensing data of "001," and output the read data RD to the outside. The data determination unit 940_a may generate read data RD indicating that the memory cells MC are in the second program state P2, based on the sensing data of "011," and output the read data RD to the outside. The data determination unit 940_a may generate read data RD indicating that the memory cells MC are in the third program state P3, based on the sensing data of "111," and output the read data RD to the outside.

As described above, the memory device 900 according to the present embodiment senses multi-bits by performing the read operation with respect to the memory cell once.

Figure 15:
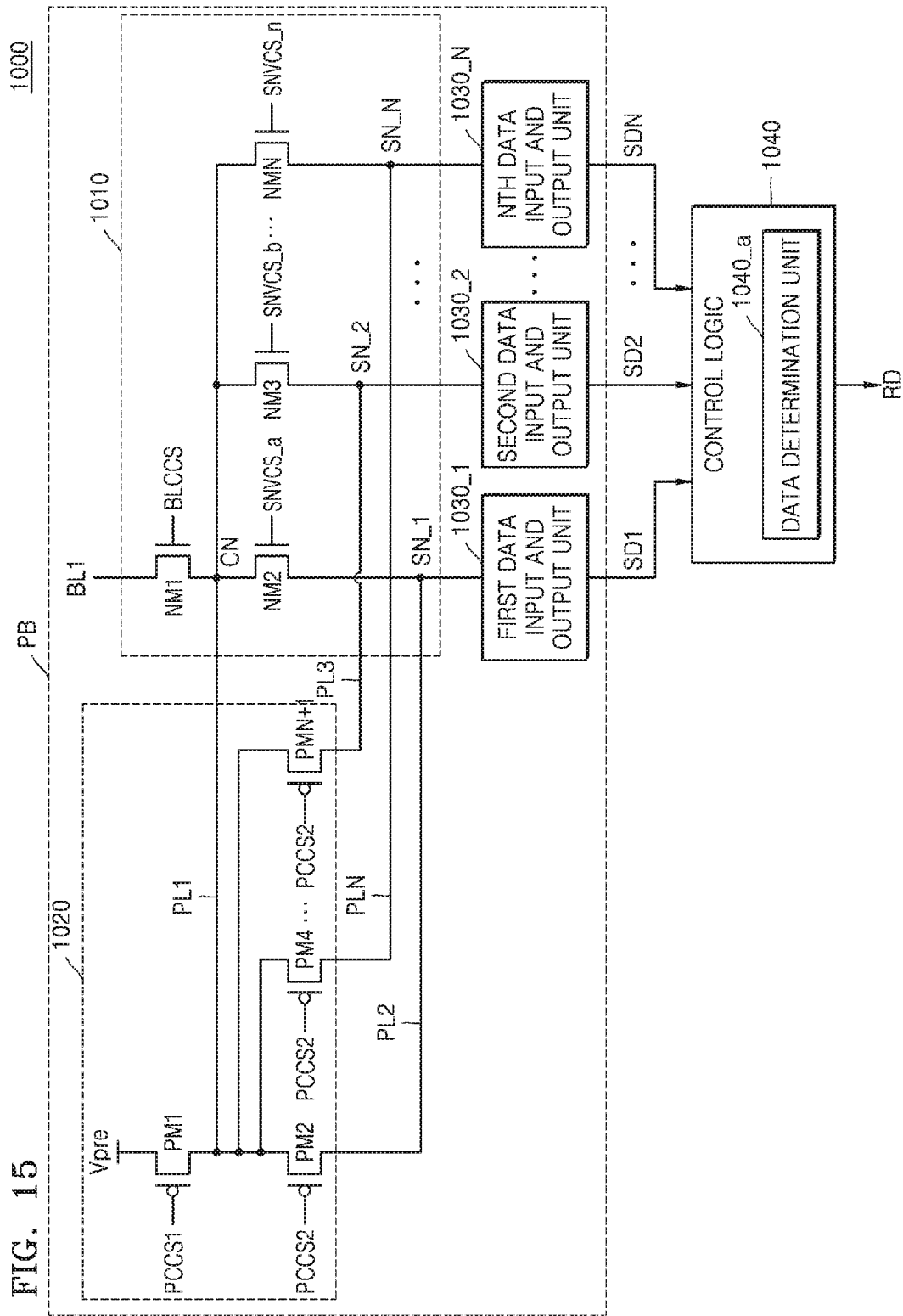
FIG. 15 is a diagram of a memory device for reading data of a k-bit multi-level cell, according to an exemplary embodiment of the inventive concept.

FIG. 15 is a diagram of a memory device 1000 for reading data of a k-bit multi-level cell, according to an exemplary embodiment of the inventive concept.

Referring to FIG. 15, the memory device 1000 may include a page buffer PB and a control logic 1040. The page buffer PB may include a bit line connection unit 1010, a pre-charge unit 1020, and data input and output units 1030_1 through 1030_N. The bit line connection unit 1010 may include second through N$^{th}$ sensing node connection transistors NM2 through NMN connected to first through N$^{th}$ sensing nodes SN_1 through SN_N, respectively. In addition, the pre-charge unit 1020 may include second through N+1$^{th}$ pre-charge transistors PM2 through PMN+1 for pre-charging the first through N$^{th}$ sensing nodes SN_1 through SN_N, respectively.

In a sensing section, the data input and output units 1030_1 through 1030_N may generate first through N$^{th}$ sensing data SD1 through SDN by sensing levels of voltages of the first through N$^{th}$ sensing nodes SN_1 through SN_N, respectively, and provide the first through N$^{th}$ sensing data SD_1 through SDN to the control logic 1040. A data determination unit 1040_a of the control logic 1040 may determine read data of a memory cell selected as an object to which a read operation is to be performed, based on the first through N$^{th}$ sensing data SD1 through SDN received from the data input and output units 1030_1 through 1030_N. Via this configuration, the memory device 1000 may read data of the k-bit multi-level cell by performing the read operation once.

Figure 16A:
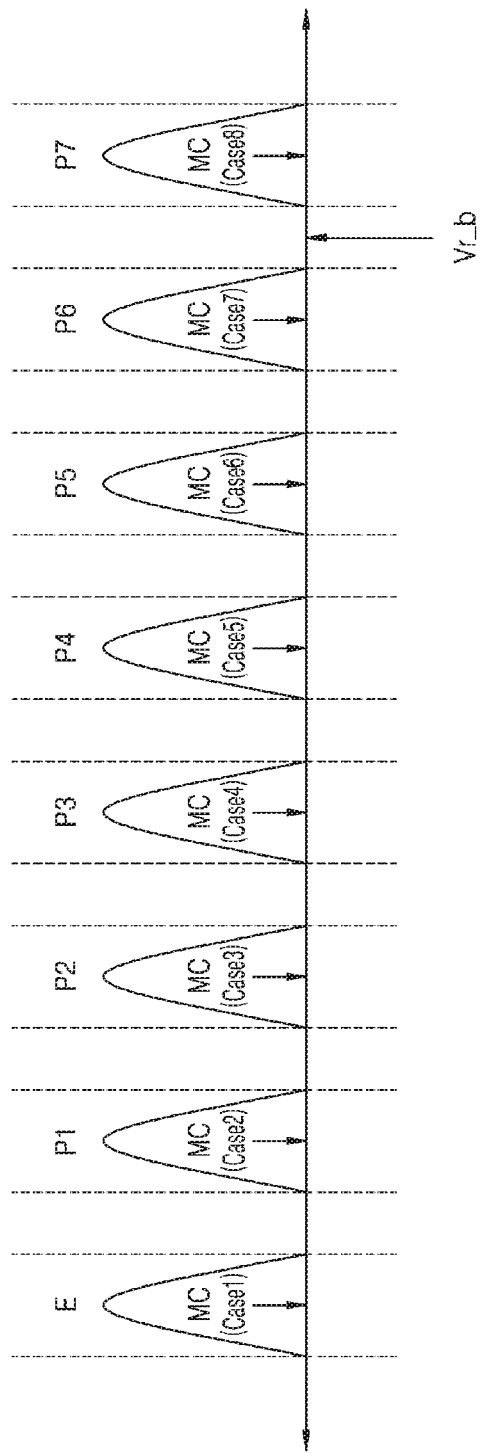
FIG. 16A is a diagram showing a threshold voltage distribution of memory cells for describing an operation of a page buffer of FIG. 15 according to an exemplary embodiment of the inventive concept.

FIG. 16A is a diagram of threshold voltage distribution of memory cells MC for describing an operation of the page buffer PB of FIG. 15 according to an exemplary embodiment of the inventive concept, and FIG. 16B is a diagram for describing a method of determining read data of the memory cells MC according to an exemplary embodiment of the inventive concept.

Referring to FIG. 16A, when the memory cells MC are three-bit multi-level cells, 8 threshold voltage distributions may be formed. A memory device according to the present embodiment may read three-bit data of the memory cells MC by performing a read operation once by using a read voltage Vr_b.

Referring to FIGS. 15, 16A, and 16B, as illustrated in a table Table_3, when the memory cells MC are in an erased state E (case 1), the data determination unit 1040_a may receive sensing data of "0000000." In addition, when the memory cells MC are in a first program state P1 (case 2), the data determination unit 1040_a may receive sensing data of "0000001." When the memory cells MC are in a second program state P2 (case 3), the data termination unit 1040_a may receive sensing data of "0000011." When the memory cells MC are in a third program state P3 (case 4), the data determination unit 1040_a may receive sensing data of "0000111." When the memory cells MC are in a fourth program state P4 (case 5), the data determination unit 1040_a may receive sensing data of "0001111." When the memory cells MC are in a fifth program state P5 (case 6), the data determination unit 1040_a may receive sensing data of "0011111." When the memory cells MC are in a sixth program state P6 (case 7), the data determination unit 1040_a may receive sensing data of "0111111." When the memory cells MC are in a seventh program state P7 (case 8), the data determination unit 1040_a may receive sensing data of "1111111." The data determination unit 1040_a may generate read data RD based on the sensing data as described above and output the read data RD to the outside.

FIG. 17A is a diagram showing threshold voltage distribution of memory cells MC for describing an operation of the page buffer PB of FIG. 13 according to an exemplary embodiment of the inventive concept, and FIG. 17B is a diagram for describing a method of determining read data of the memory cells MC according to an exemplary embodiment of the inventive concept.

Referring to FIGS. 13 and 17A, when the memory cells MC are three-bit multi-level cells, the operation of reading data of the memory cells MC may be performed by using the configuration of the page buffer PB of FIG. 13. According to an exemplary embodiment of the inventive concept, in a first step step 1, data corresponding to an erase state E, and first and second program states P1 and P2 of the memory cells MC may be read by using a first read voltage Vr_b1. In a second step step 2, data corresponding to third through fifth program states P3 through P5 of the memory cells MC may be read by using a second read voltage Vr_b2. In addition, in a third step step 3, data corresponding to sixth and seventh program states P6 and P7 may be read by using a third read voltage Vr_b3.

Referring to FIGS. 13 and 17B, as illustrated in a table Table_4, when the memory device 900 performs the read operation in the first step step 1 by using the first read voltage Vr_b1, the data determination unit 940_a may receive sensing data of "000," when the memory cells MC are in the erased state E (case 1). When the memory cells MC are in the first program state P1 (case 2), the data determination unit 940_a may receive sensing data of "001." When the memory cells MC are in the second program state P2 (case 3), the data termination unit 940_a may receive sensing data of "011." When the memory cells MC are in the third through seventh program states P3 through P7 (cases 4 through 8), the data determination unit 940_a may receive sensing data of "111." When the control logic 940 receives the sensing data of "111" in the first step step 1, the control logic 940 may control the read operation by using the second read voltage Vr_b2 in the second step step 2. Thereafter, when the memory cells MC are in the third program state P3 (case 4), the data determination unit 940_a may receive the sensing data of "000" in the second step step 2.

When the memory cells MC are in the fourth program state P4 (case 5), the data determination unit 940_a may receive the sensing data of "001." When the memory cells MC are in the fifth program state P5 (case 6), the data determination unit 940_a may receive the sensing data of "011." When the memory cells MC are in the sixth and seventh program states P7 and P8 (cases 7 and 8), the data determination unit 940_a may receive the sensing data of "111." When the control logic 940 receives the sensing data of "111" in the second step step 2, the control logic 940 may control the read operation by using the third read voltage Vr_b3 in the third step step 3.

Then, when the memory cells MC are in the sixth program state P6 (case 7), the data determination unit 940_a may receive the sensing data of "011" in the third step step 3. When the memory cells MC are in the seventh program state P7 (case 8), the data determination unit 940_a may receive the sensing data of "111." As described above, the data determination unit 940_a may generate the read data RD indicating each of the erase state E and the first through the seventh program states P1 through P7, based on the sensing data received in the first through third steps step 1 through step 3, and output the read data RD to the outside.

Via this configuration, the memory device 900 according to the present embodiment may minimize the number of read operations with respect to a three-bit multi-level cell to sense the multi-bits of the memory cells MC.

Figure 18:
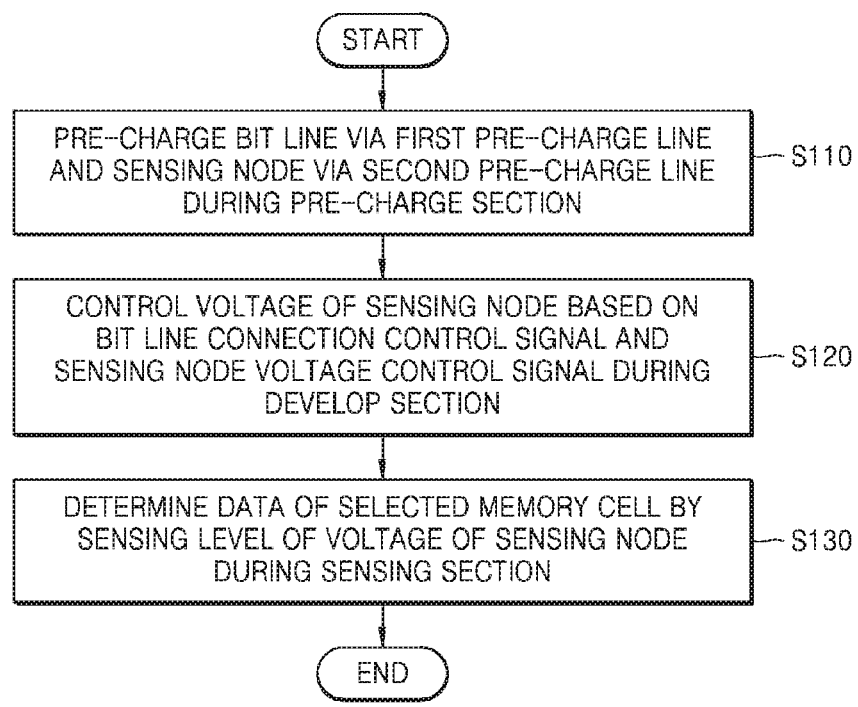
FIG. 18 is a flowchart of a read operation method of a memory device, according to an exemplary embodiment of the inventive concept.

FIG. 18 is a flowchart of a reading method of a memory device, according to an exemplary embodiment of the inventive concept.

Referring to FIG. 18, the reading method of the memory device according to the present embodiment is a method of sensing a sensing node of a page buffer, for reading data stored in a memory cell array included in the memory device. The descriptions with respect to the memory devices 20, 100, 200, 600, 700, and 900 and the memory system 1 with reference to FIGS. 1 through 17B may be applied to the reading method of the memory device according to the present embodiment.

First, during a pre-charge section, a bit line connected to a memory cell that is an object to which a read operation is to be performed and to a page buffer may be pre-charged via a first pre-charge line, and a sensing node of the page buffer may be pre-charged via a second pre-charge line, in operation S110. According to an exemplary embodiment of the inventive concept, the bit line may be pre-charged to a voltage based on a characteristic of a bit line connection transistor included in a bit line connection unit. In addition, timings at which the bit line starts to be pre-charged and the sensing node starts to be pre-charged may be different.

Thereafter, the bit line connection unit of the page buffer may control a voltage of the sensing node based on a bit line connection control signal, during a develop section, in operation S120. For example, in the develop section, a sensing node connection transistor connected to the sensing node may control the voltage of the sensing node by using a voltage of the bit line, a threshold voltage of the sensing node connection transistor, and a sensing node voltage control signal.

During a sensing section, a data input and output unit may sense a level of the voltage of the sensing node and determine data of the memory cell selected as the object to which the read operation is to be performed, in operation S130. The determined data may be transmitted to a memory controller via a control logic.

Figure 19:
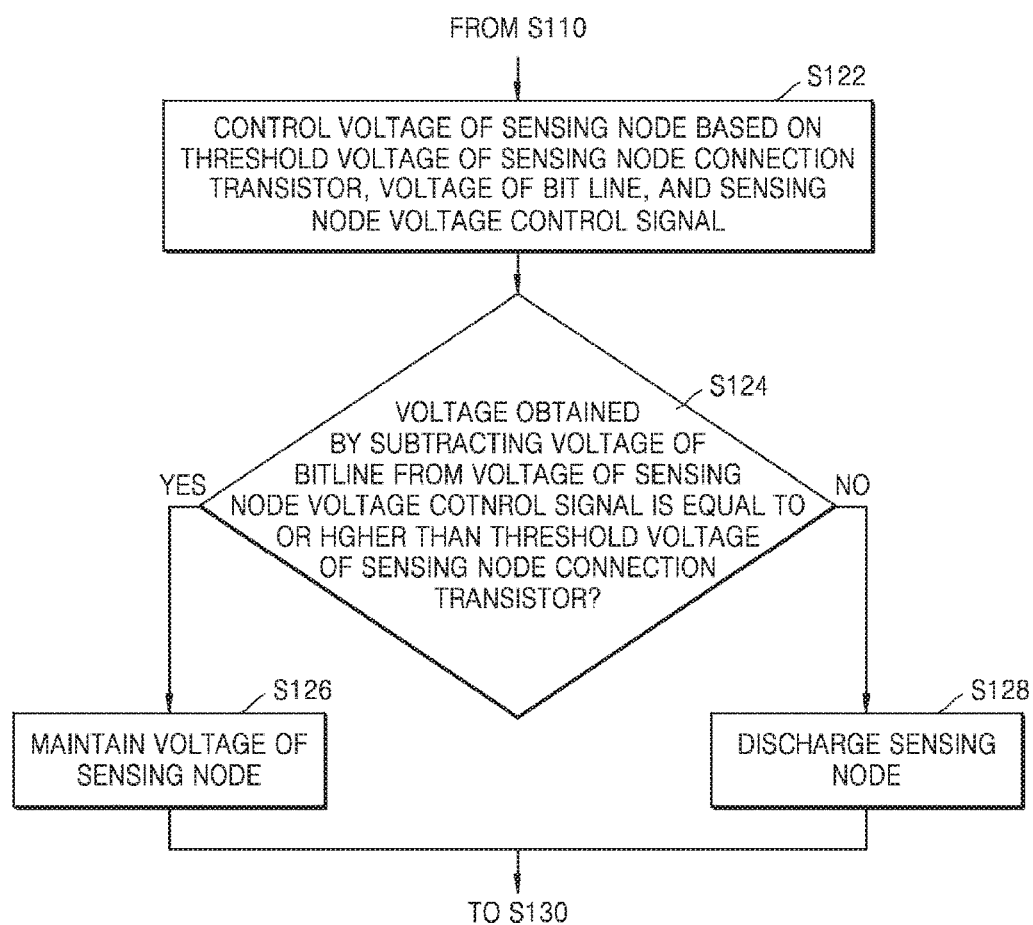
FIG. 19 is a detailed flowchart of an operation of controlling a voltage of a sensing node in the read operation method of FIG. 18 according to an exemplary embodiment of the inventive concept.

FIG. 19 is a detailed flowchart of controlling the voltage of the sensing node of FIG. 18 according to an exemplary embodiment of the inventive concept.

Referring to FIG. 19, in the develop section, the voltage of the sensing node may be controlled based on the threshold voltage of the sensing node connection transistor, the voltage of the bit line, and the sensing node voltage control signal, in operation S122. For example, it may be determined whether a voltage obtained by subtracting the voltage of the bit line from the sensing node voltage control signal is equal to or higher than the threshold voltage of the sensing node connection transistor, in operation S124. For example, when the voltage obtained by subtracting the voltage of the bit line from the sensing node voltage control signal is equal to or higher than the threshold voltage of the sensing node connection transistor (S124, YES), the voltage of the sensing node may be maintained (S126). As another example, when the voltage obtained by subtracting the voltage of the bit line from the sensing node voltage control signal is less than the threshold voltage of the sensing node connection transistor (S124, NO), the sensing node may be discharged (S128).

Figure 20:
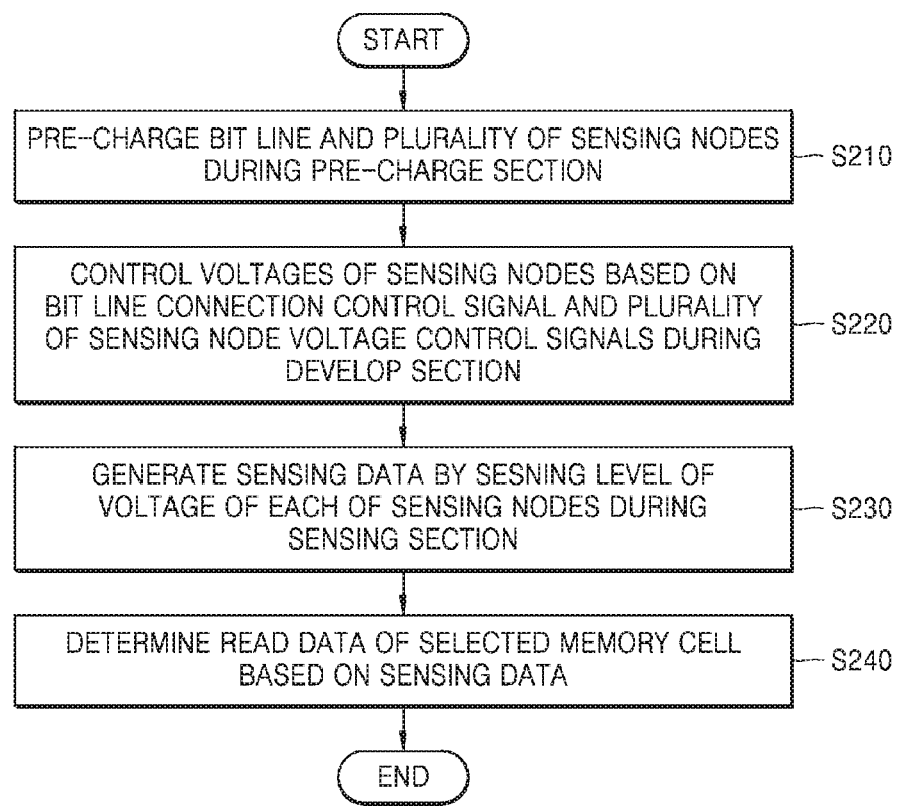
FIG. 20 is a flowchart of a read operation method of a memory device, with respect to a multi-bit memory cell, according to an exemplary embodiment of the inventive concept.

FIG. 20 is a flowchart of a reading method of a memory device having multi-bit memory cells, according to an exemplary embodiment of the inventive concept.

First, one page buffer may include a plurality of sensing nodes, and may pre-charge a bit line and a plurality of sensing nodes during a pre-charge section, in operation S210. During a develop section, voltages of the sensing nodes may be controlled based on a bit line connection control signal and a plurality of sensing node voltage control signals, in operation S220. During a sensing section, a plurality of pieces of sensing data may be generated by sensing a voltage of each of the sensing nodes in operation S230. Read data of a memory cell selected as an object to which a read operation is to be performed may be determined based on the plurality of pieces of sensing data, in operation S240.

Figure 21:
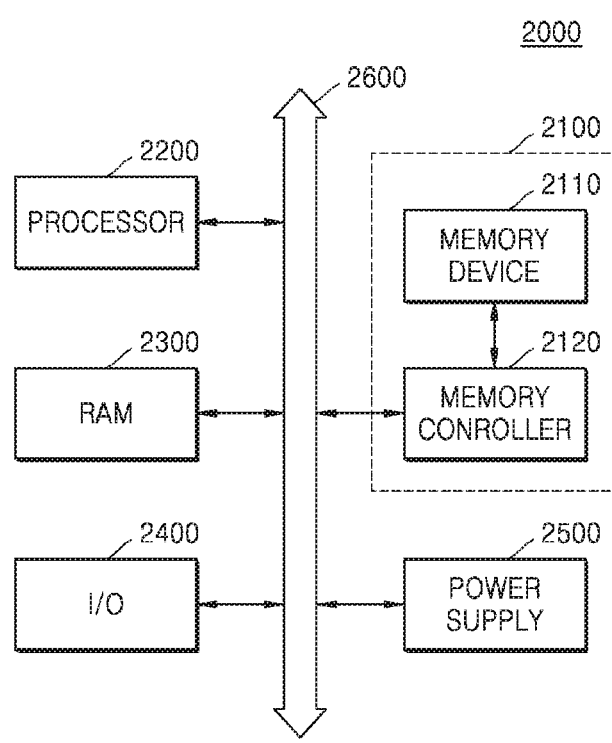
FIG. 21 is a block diagram illustrating a device including a memory system according to an exemplary embodiment of the inventive concept.

FIG. 21 is a block diagram illustrating a device including a memory system according to an exemplary embodiment of the inventive concept.

Referring to FIG. 21, a device 2000 may include a processor 2200, a RAM 2300, an input/output unit and/or interface 2400, a power supply 2500 and a memory system 2100 connected via bus 2600. The memory system 2100 may include a memory device 2110 and a memory controller 2120 which correspond, respectively, to the memory devices and memory controllers described above with reference to exemplary embodiments of the inventive concept.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A page buffer, comprising:
   a pre-charge unit for pre-charging a bit line of a selected memory cell of a memory cell array via a first pre-charge line and pre-charging a sensing node via a second pre-charge line, wherein the bit line of the selected memory cell and the sensing node are pre-charged during a pre-charge time;
   a bit line connection unit connected between the bit line and the sensing node and comprising a connecting node directly connected to the first pre-charge line, wherein the bit line connection unit controls a voltage of the sensing node, during a develop time, based on a bit line connection control signal and a sensing node voltage control signal, wherein the bit line connection unit includes a pair of transistors connected in series between the bit line and the sensing node, and wherein the connecting node is disposed between the pair of transistors; and
   a data input and output unit for generating sensing data by sensing a level of the voltage of the sensing node, during a sensing time,
   wherein the pre-charge unit comprises:
   a bit line pre-charge transistor comprising a first terminal, a second terminal, and a gate terminal, wherein the first terminal receives a pre-charge voltage, the second terminal is connected to the connecting node, and the gate terminal receives a bit line pre-charge control signal; and
   a sensing node pre-charge transistor comprising a first terminal, a second terminal, and a gate terminal, wherein the first terminal is connected to the second terminal of the bit line pre-charge transistor, the second terminal is connected to the sensing node, and the gate terminal receives a sensing node pre-charge control signal,
   wherein the pre-charge unit controls a start time at which the bit line is pre-charged and a start time at which the sensing node is pre-charged to be different from each other, based on the bit line pre-charge control signal and the sensing node pre-charge control signal.

2. The page buffer of claim 1, wherein the pre-charge unit controls the start time at which the sensing node is pre-charged to be slower than the start time at which the bit line is pre-charged.

3. The page buffer of claim 1, wherein the pre-charge unit comprises:
- a first pre-charge transistor comprising a first terminal, a second terminal, and a gate terminal, wherein the first terminal receives a first pre-charge voltage, the second terminal is connected to the connecting node, and the gate terminal receives a bit line pre-charge control signal; and
- a second pre-charge transistor comprising a first terminal, a second terminal, and a gate terminal, wherein the first terminal receives a second pre-charge voltage, the second terminal is connected to the sensing node, and the gate terminal receives a sensing node pre-charge control signal.

4. The page buffer of claim 3, wherein the second pre-charge voltage is higher than the first pre-charge voltage.

5. The page buffer of claim 1, wherein the pair of transistors of the bit line connection unit comprises:
- a bit line connection transistor comprising a first terminal, a second terminal, and a gate terminal, wherein the first terminal is connected to the connecting node, the second terminal is connected to the bit line, and the gate terminal receives the bit line connection control signal; and
- a sensing node connection transistor comprising a first terminal, a second terminal, and a gate terminal, wherein the first terminal is connected to the sensing node, the second terminal is connected to the connecting node, and the gate terminal receives the sensing node voltage control signal.

6. The page buffer of claim 5, wherein the pre-charge unit pre-charges the bit line based on the bit line connection control signal and a threshold voltage of the bit line connection transistor.

7. The page buffer of claim 6, wherein the pre-charge unit pre-charges the bit line to a voltage obtained by subtracting the threshold voltage of the bit line connection transistor from the bit line connection control signal.

8. The page buffer of claim 5, wherein the sensing node connection transistor controls the voltage of the sensing node based on a voltage of the bit line, the sensing node voltage control signal and a threshold voltage of the sensing node connection transistor.

9. The page buffer of claim 8, wherein the sensing node connection transistor discharges the sensing node, when a voltage obtained by subtracting the voltage of the bit line from the sensing node voltage control signal is equal to or higher than the threshold voltage of the sensing node connection transistor.

10. The page buffer of claim 5, wherein a magnitude of the bit line connection control signal and a magnitude of the sensing node voltage control signal are different from each other.

11. The page buffer of claim 5, wherein a magnitude of a threshold voltage of the bit line connection transistor and a magnitude of a threshold voltage of the sensing node connection transistor are different from each other, and a magnitude of the bit line connection control signal and a magnitude of the sensing node voltage control signal are the same as each other.

12. A memory device, comprising:
- a memory cell array comprising a plurality of memory cells;
- a page buffer connected to a bit line of a selected memory cell of the memory cell array; and
- a control logic for controlling a data sensing operation of the page buffer, wherein the page buffer comprises:
- a pre-charge unit for pre-charging the bit line and a plurality of sensing nodes, during a pre-charge time;
- a bit line connection unit connected between the bit line and the plurality of sensing nodes and comprising a connecting node connected to the pre-charge unit, wherein the bit line connection unit controls voltages of the plurality of sensing nodes, during a develop time, based on a bit line connection control signal and a plurality of sensing node voltage control signals, the bit line connection control signal and the plurality of sensing node voltage control signals being received from the control logic; and
- a plurality of data input and output units for generating a plurality of pieces of sensing data by sensing levels of the voltages of corresponding sensing nodes from among the plurality of sensing nodes, wherein the pre-charge unit is configured to pre-charge the bit line using a first precharge line directly connected to the connecting node and pre-charge the sensing nodes using a plurality of second precharge lines directly connected to the sensing nodes, wherein the bit line connection unit comprises:
- a bit line connection transistor comprising a first terminal, a second terminal, and a gate terminal, wherein the first terminal is connected to the connecting node, the second terminal is connected to the bit line, and the gate terminal receives the bit line connection control signal;
- a first sensing node connection transistor comprising a first terminal, a second terminal, and a gate terminal, wherein the first terminal is connected to a first sensing node, the second terminal is connected to the connecting node, and the gate terminal receives a first sensing node voltage control signal; and
- a second sensing node connection transistor comprising a first terminal, a second terminal, and a gate terminal, wherein the first terminal is connected to a second sensing node, the second terminal is connected to the connecting node, and the gate terminal receives a second sensing node voltage control signal, wherein the first sensing node connection transistor discharges the first sensing node, when a voltage of the bit line has a first magnitude, based on the first sensing node voltage control signal, and the second sensing node connection transistor discharges the second sensing node, when the voltage of the bit line has a second magnitude that is less than the first magnitude, based on the second sensing node voltage control signal.

13. The memory device of claim 12, wherein a magnitude of the first sensing node voltage control signal and a magnitude of the second sensing node voltage control signal are different from each other.

14. The memory device of claim 12, wherein the control logic determines data of the selected memory cell from the plurality of pieces of sensing data received from the plurality of data input and output units.

15. The memory device of claim 12, wherein the control logic provides the plurality of sensing node voltage control signals to the bit line connection unit by adjusting magnitudes of the plurality of sensing node voltage control signals based on adjustment information.

16. A memory device, comprising:
- a memory cell array comprising a plurality of memory cells;
- a page buffer connected to a bit line of a selected memory cell of the memory cell array; and a control logic for controlling a data sensing operation of the page buffer, wherein the page buffer comprises:

a pre-charge unit for pre-charging the bit line and a plurality of sensing nodes, during a pre-charge time;

a bit line connection unit connected between the bit line and the plurality of sensing nodes and comprising a connecting node connected to the pre-charge unit, wherein the bit line connection unit controls voltages of the plurality of sensing nodes, during a develop time, based on a bit line connection control signal and a plurality of sensing node voltage control signals, the bit line connection control signal and the plurality of sensing node voltage control signals being received from the control logic; and a plurality of data input and output units for generating a plurality of pieces of sensing data by sensing levels of the voltages of corresponding sensing nodes from among the plurality of sensing nodes, wherein the pre-charge unit is configured to pre-charge the bit line using a first precharge line directly connected to the connecting node and pre-charge the sensing nodes using a plurality of second precharge lines directly connected to the sensing nodes, wherein the bit line connection unit comprises:

a bit line connection transistor comprising a first terminal, a second terminal, and a gate terminal, wherein the first terminal is connected to the connecting node, the second terminal is connected to the bit line, and the gate terminal receives the bit line connection control signal;

a first sensing node connection transistor comprising a first terminal, a second terminal, and a gate terminal, wherein the first terminal is connected to a first sensing node, the second terminal is connected to the connecting node, and the gate terminal receives a first sensing node voltage control signal; and a second sensing node connection transistor comprising a first terminal, a second terminal, and a gate terminal, wherein the first terminal is connected to a second sensing node, the second terminal is connected to the connecting node, and the gate terminal receives a second sensing node voltage control signal, wherein a threshold voltage of the first sensing node connection transistor and a threshold voltage of the second sensing node connection transistor are different from each other, and a magnitude of the first sensing node voltage control signal and a magnitude of the second sensing node voltage control signal are the same as each other.

* * * * *